US009954160B2

United States Patent
Ishigami et al.

(10) Patent No.: US 9,954,160 B2
(45) Date of Patent: Apr. 24, 2018

(54) WIRING BOARD, METHOD OF MANUFACTURING THE SAME, ELEMENT HOUSING PACKAGE, ELECTRONIC DEVICE, ELECTRONIC APPARATUS, AND MOVING OBJECT

(71) Applicant: Seiko Epson Corporation, Tokyo (JP)

(72) Inventors: Hideki Ishigami, Hachinohe (JP); Hidefumi Nakamura, Hachinohe (JP); Yukihiko Shiohara, Hachinohe (JP); Tetsuya Otsuki, Fujimi (JP); Tetsuro Miyao, Suwa (JP)

(73) Assignee: Seiko Epson Corporation (JP)

( * ) Notice: Subject to any disclaimer, the term of this patent is extended or adjusted under 35 U.S.C. 154(b) by 672 days.

(21) Appl. No.: 14/538,289

(22) Filed: Nov. 11, 2014

(65) Prior Publication Data

US 2015/0130326 A1    May 14, 2015

(30) Foreign Application Priority Data

Nov. 12, 2013  (JP) .................................. 2013-234422
Aug. 20, 2014  (JP) .................................. 2014-167732

(51) Int. Cl.
*H01L 41/053*    (2006.01)
*H01L 41/047*    (2006.01)
(Continued)

(52) U.S. Cl.
CPC ........ *H01L 41/0475* (2013.01); *H01L 41/053* (2013.01); *H05K 3/4046* (2013.01); *H01L 2224/16225* (2013.01); *H01L 2224/48091* (2013.01); *H01L 2224/73265* (2013.01); *H01L 2924/16152* (2013.01); *H03H 9/1021* (2013.01); *H03H 9/17* (2013.01); *H05K 1/0306* (2013.01); *H05K 1/09* (2013.01); *H05K 3/1216* (2013.01);
(Continued)

(58) Field of Classification Search
CPC ...... H01L 41/053; H03H 9/05; H03H 9/0504; H03H 9/0514
USPC ......................................... 310/344, 348, 370
See application file for complete search history.

(56) References Cited

U.S. PATENT DOCUMENTS 6,229,404 B1    5/2001  Hatanaka
2009/0167116 A1*  7/2009  Miyashita ............ H03H 9/0514
                                                                310/348
(Continued)

FOREIGN PATENT DOCUMENTS

JP    2000-077942 A    3/2000
JP    2003-101181 A    4/2003
(Continued)

*Primary Examiner* — Derek Rosenau
(74) *Attorney, Agent, or Firm* — Harness, Dickey & Pierce, P.L.C.

(57) ABSTRACT

A method of manufacturing a vibrator which includes a method of manufacturing a wiring board includes disposing one granular conductor within each of through holes of a ceramic substrate having the through holes formed therein, supplying a glass paste into the through holes, baking the glass paste, forming an electrode, and disposing a vibrator element and a lid. When a maximum diameter of the granular conductor is set to $d_1$ and a minimum diameter of each of the through holes is set to $d_2$, $d_1/d_2$ is preferably equal to or greater than 0.8 and equal to or less than 1.

14 Claims, 13 Drawing Sheets

(51) Int. Cl.
*H05K 3/40* (2006.01)
*H05K 1/03* (2006.01)
*H03H 9/17* (2006.01)
*H03H 9/10* (2006.01)
*H05K 1/09* (2006.01)
*H05K 3/12* (2006.01)

(52) U.S. Cl.
CPC . *H05K 3/4061* (2013.01); *H05K 2201/10234* (2013.01); *Y10T 29/49165* (2015.01)

(56) References Cited

U.S. PATENT DOCUMENTS

| | | | |
|---|---|---|---|
| 2011/0050045 A1* | 3/2011 | Aratake | H03H 9/1021 310/344 |
| 2012/0223622 A1 | 9/2012 | Otsuki | |
| 2013/0049542 A1 | 2/2013 | Otsuki | |

FOREIGN PATENT DOCUMENTS

| | | |
|---|---|---|
| JP | 2008-004927 A | 1/2008 |
| JP | 2008-041814 A | 2/2008 |
| JP | 2009-059789 A | 3/2009 |
| JP | 2012-182765 A | 9/2012 |
| JP | 2013-046167 A | 3/2013 |
| JP | 2013-046168 A | 3/2013 |

* cited by examiner

WIRING BOARD, METHOD OF MANUFACTURING THE SAME, ELEMENT HOUSING PACKAGE, ELECTRONIC DEVICE, ELECTRONIC APPARATUS, AND MOVING OBJECT

BACKGROUND

1. Technical Field

The present invention relates to a wiring board, a method of manufacturing the same, an element housing package, an electronic device, an electronic apparatus, and a moving object.

2. Related Art

Ceramic wiring boards are more excellent than organic wiring boards from the viewpoint of thermal conductivity, heat resistance, chemical stability, and the like. Thus, ceramic wiring boards can increase the density of wiring boards and contribute to a reduction in the size of electronic apparatuses.

Such a ceramic wiring board is provided with a through wiring passing therethrough in a thickness direction, and thus can be used as an interposer substrate.

For example, JP-A-2008-004927 discloses a laminated mounting structure that includes a first substrate, a second substrate, and an intermediate substrate which is provided between the first and second substrates. The intermediate substrate is provided with a through hole that passes therethrough in a thickness direction. Further, an elastic conductive ball having a size larger than a depth and an inner diameter of the through hole is pressed into the through hole. Thus, an electrode provided in the first substrate and an electrode provided in the second substrate are electrically connected to each other through the elastic conductive ball.

On the other hand, ceramic wiring boards have been used as substrates for packages of various types of devices, on the basis of excellent gas impermeability derived from the ceramics.

A piezoelectric device using a piezoelectric material such as, for example, quartz crystal has been used in many fields as a vibration device such as a piezoelectric vibrator, a resonator, and a filter. Among these, the piezoelectric vibrator (vibration device) is frequently used in electronic apparatuses as a time source, a timing source such as a control signal, a reference signal source, and the like. The piezoelectric vibrator includes a piezoelectric vibrator element and an excitation electrode which is provided on both principal surfaces of a vibration region in the piezoelectric vibrator element. In order to use the piezoelectric vibrator as the above-described time source and the like, the piezoelectric vibrator is required to be accurately oscillated at an intended resonance frequency.

However, in the piezoelectric vibrator element, frequency characteristics may change unintentionally due to the aging deterioration of the material thereof or the attachment of impurities. Consequently, the piezoelectric vibrator element is accommodated in a package, and the package is airtightly sealed, thereby suppressing the material deterioration and the attachment of impurities on the piezoelectric vibrator element over a long period and suppressing changes in frequency characteristics. On the other hand, electric wiring that connects the inside and outside of the package is required in order to drive the piezoelectric vibrator element, and thus through wiring is formed in the package.

A ceramic wiring board is used as a substrate constituting a portion of such a package for the piezoelectric vibrator.

Consequently, when the ceramic wiring board disclosed in JP-A-2008-004927 is applied to a ceramic wiring board for a piezoelectric vibrator, it is possible to form a through wiring passing through the ceramic wiring board by using an elastic conductive ball.

However, since the elastic conductive ball is merely pressed into the through hole, it is difficult to airtightly seal the through hole.

SUMMARY

An advantage of some aspects of the invention is to provide a wiring board that includes a through wiring with a low resistance and has airtightness, a method of manufacturing a wiring board which is used to be capable of easily manufacturing the wiring board, an element housing package including the wiring board, an electronic device including the element housing package, and an electronic apparatus and a moving object which include the electronic device.

An aspect of the invention is directed to a method of manufacturing a wiring board including a through electrode. The method includes disposing one granular conductor within a through hole of a ceramic substrate having the through hole formed therein; supplying a composition containing glass powder into the through hole; and heating the composition.

According to the method, since a conductive path is formed which includes the granular conductor with a small internal resistance and a high conductivity and a sealing portion with a low air permeability which is made of glass, the wiring board including a low resistance through wiring and having airtightness is obtained.

In the method of manufacturing a wiring board according to the aspect of the invention, it is preferable that, when a maximum diameter of the granular conductor is set to $d_1$ and a minimum diameter of the through hole is set to $d_2$, $d_1/d_2$ is equal to or greater than 0.8 and equal to or less than 1.

With this configuration, only one granular conductor is easily disposed within the through hole, and there is a tendency for an upper end portion and a lower end portion of the granular conductor to be exposed from the sealing portion, and thus it is possible to further increase the conductivity of the through electrode. In addition, it is possible to optimize the size of the gap between the granular conductor and the through hole, and thus the volume of the sealing portion is suitable for the achievement of both mechanical strength and airtightness. For this reason, it is possible to further increase the airtightness of the through hole. Further, the gap between the granular conductor and the through hole is optimized, and the degree of a capillary phenomenon in a manufacturing process of the sealing portion is particularly increased, and thus it is possible to further reliably block a ventilation path remaining within the through hole and particularly to increase the airtightness of the through hole.

In the method of manufacturing a wiring board according to the aspect of the invention, it is preferable that, when a maximum diameter of the granular conductor is set to $d_1$ and a minimum length of the through hole is set to L, $d_1/L$ is equal to or greater than 0.8 and equal to or less than 1.

With this configuration, there is a low probability of the granular conductor protruding from an upper surface and a lower surface of the ceramic substrate. Accordingly, the flatness of the surface of the wiring board is increased, and thus, for example, other electrodes are easily formed so as to be continuous with the through electrode.

In the method of manufacturing a wiring board according to the aspect of the invention, it is preferable that, when a volume of the through hole is set to $V_1$ and a volume of the granular conductor is set to $V_2$, a volume of the composition supplied into the through hole is smaller than $V_1-V_2$.

With this configuration, there is a tendency for the upper end portion and the lower end portion of the granular conductor to be exposed from the sealing portion. Thus, for example, when other electrodes are formed so as to be continuous with the through electrode, it is possible to further increase conductivity between the through electrode and other electrodes.

In the method of manufacturing a wiring board according to the aspect of the invention, it is preferable that a constituent material of the glass powder is a glass material including $B_2O_3$ and $SiO_2$.

With this configuration, such a glass material has a relatively high adhesion with a metal material and a ceramic material and has a low air permeability. For this reason, it is possible to obtain the wiring board having a high airtightness by using a composition including such a glass material. In addition, since the glass material has a sufficient fluidity when being melted, there is a tendency for a sufficient driving force to be generated due to a capillary phenomenon, and thus it is possible to more reliably block a ventilation path remaining within the through hole and to contribute to an improvement in airtightness.

In the method of manufacturing a wiring board according to the aspect of the invention, it is preferable that, when an average particle size of the glass powder is set to $d_3$ and a minimum diameter of the through hole is set to $d_2$, $d_3/d_2$ is equal to or greater than 0.005 and equal to or less than 0.02.

With this configuration, it is possible to put an appropriate amount of glass powder into the through hole. For this reason, when a composition including the glass powder is heated, there is a tendency for the composition and the melt of the glass powder to penetrate a gap between the granular conductor and the through hole, and thus the blocking of the ventilation path using the capillary phenomenon as a driving force becomes more conspicuous.

In the method of manufacturing a wiring board according to the aspect of the invention, it is preferable that a thermal expansion coefficient of the glass powder is equal to or greater than $2 \times 10^{-6}$ [/° C.] and equal to or less than $15 \times 10^{-6}$ [/° C.], and a thermal expansion coefficient of the granular conductor is equal to or greater than $4 \times 10^{-6}$ [/° C.] and equal to or less than $20 \times 10^{-6}$ [/° C.].

With this configuration, even when a change in temperature occurs in the wiring board, a gap is not likely to be generated between the granular conductor and the through hole. Thus, it is possible to suppress a decrease in the airtightness of the wiring board due to the change in temperature.

In the method of manufacturing a wiring board according to the aspect of the invention, it is preferable that a constituent material of the granular conductor is an Fe—Ni—Co based alloy or an Fe—Ni based alloy.

The alloys have a thermal expansion coefficient which particularly approximates that of the ceramic material, and thus a gap is not particularly likely to be generated between the granular conductor and the through hole.

Another aspect of the invention is directed to a wiring board including a ceramic substrate; a through hole that passes through the ceramic substrate; one granular conductor that is provided within the through hole; and a sealing portion that seals the through hole. The sealing portion, which is an annular portion formed of a glass material, is provided between the granular conductor and an inner surface of the through hole so that a portion of the granular conductor is exposed.

According to the configuration, the wiring board including a low resistance through wiring and having airtightness is obtained.

It is preferable that the wiring board according to the aspect of the invention further includes an annular concave portion which surrounds the portion of the granular conductor and is recessed further than the portion of the granular conductor in a thickness direction of the ceramic substrate.

With this configuration, when a connection electrode is formed so as to be electrically connected to the granular conductor, the connection electrode is put into an annular concave portion provided so as to surround the vicinity of a portion of the granular conductor. Accordingly, an action in which the connection electrode grips a portion of the granular conductor occurs, and thus it is possible to further increase adhesion between the granular conductor and the connection electrode.

In the wiring board according to the aspect of the invention, it is preferable that the sealing portion and the granular conductor are exposed to an inner surface of the concave portion.

With this configuration, when the connection electrode is formed so as to be put into the concave portion, the connection electrode comes into contact with both the sealing portion and the granular conductor. Accordingly, for example, even when the granular conductor expands or contracts due to the influence of temperature or the like, stress is not likely to concentrate on a specific location, and thus it is possible to suppress the release of the connection state between the granular conductor and the connection electrode.

Still another aspect of the invention is directed to an element housing package including the wiring board according to the aspect of the invention.

With this configuration, a highly-reliable element housing package including a low resistance through wiring and having airtightness is obtained.

Yet another aspect of the invention is directed to an electronic device including the element housing package according to the aspect of the invention, an element that is accommodated in the element housing package, and an electric wiring that electrically connects the wiring board and the element which are included in the element housing package.

With this configuration, a highly-reliable electronic device including a low resistance through wiring and accommodating an element in an airtight space thereof is obtained.

In the electronic device according to the aspect of the invention, it is preferable that the element is a vibrator element.

With this configuration, a highly-reliable vibrator including a low resistance through wiring and a wiring board with airtightness is obtained.

Still yet another aspect of the invention is directed to an electronic apparatus including the electronic device according to the aspect of the invention.

With this configuration, a highly-reliable electronic apparatus is obtained.

Further another aspect of the invention is directed to a moving object including the electronic device according to the aspect of the invention.

With this configuration, a highly-reliable moving object is obtained.

BRIEF DESCRIPTION OF THE DRAWINGS

The invention will be described with reference to the accompanying drawings, wherein like numbers reference like elements.

FIGS. 8J to 8M are diagrams (cross-sectional views) illustrating the method of manufacturing a vibrator which includes the method of manufacturing a wiring board according to the embodiment of the invention.

DESCRIPTION OF EXEMPLARY EMBODIMENTS

Hereinafter, a wiring board, a method of manufacturing the same, an element housing package, an electronic device, an electronic apparatus, and a moving object according to the invention will be described in detail with reference to preferred embodiments shown in the accompanying drawings.

Electronic Device, Element Housing Package, and Wiring Board

First Embodiment

First, a first embodiment of an electronic device according to the invention, a first embodiment of an element housing package according to the invention, and a first embodiment of a wiring board according to the invention will be described.

Figure 1:
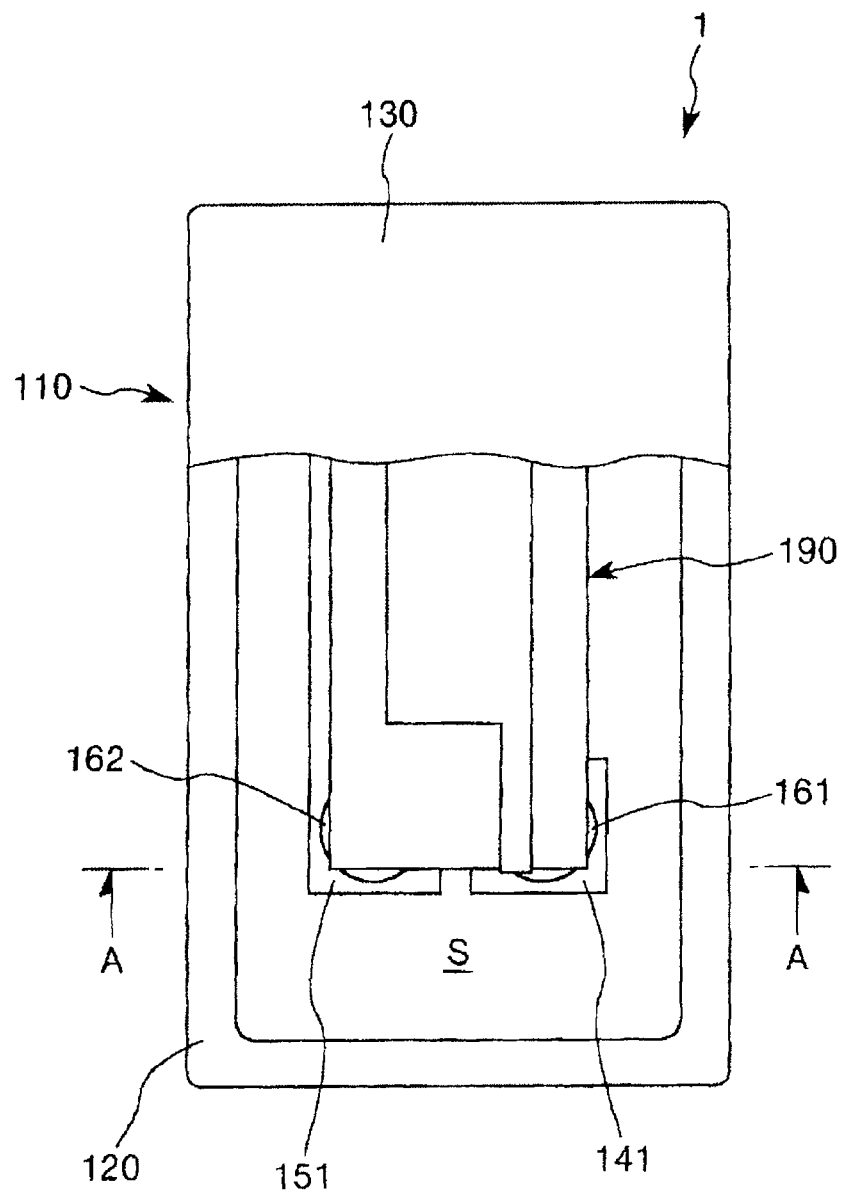
FIG. 1 is a plan view showing a vibrator to which an embodiment of an electronic device according to the invention is applied.
Figure 2:
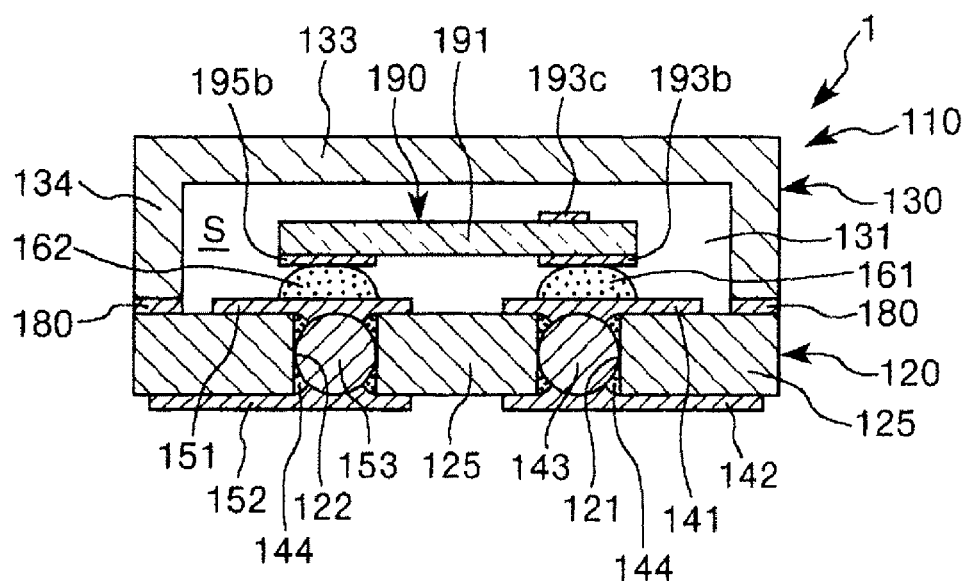
FIG. 2 is a cross-sectional view taken along line A-A of FIG. 1.
Figure 3A:
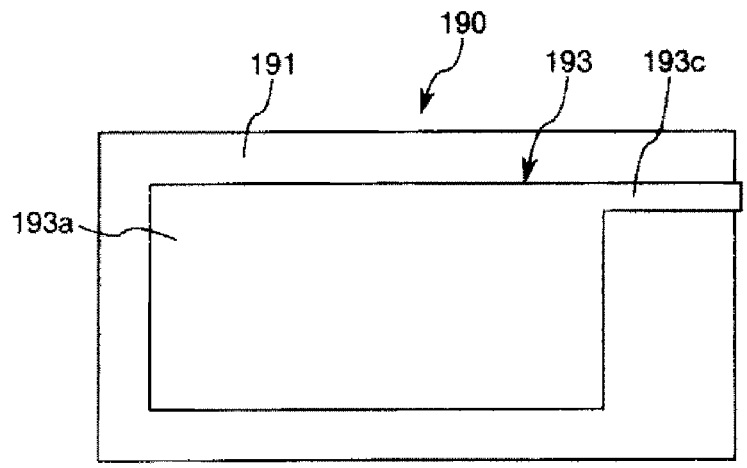
FIGS. 3A and 3B are plan views of a vibrator element including the vibrator shown in FIG. 1.
Figure 3B:
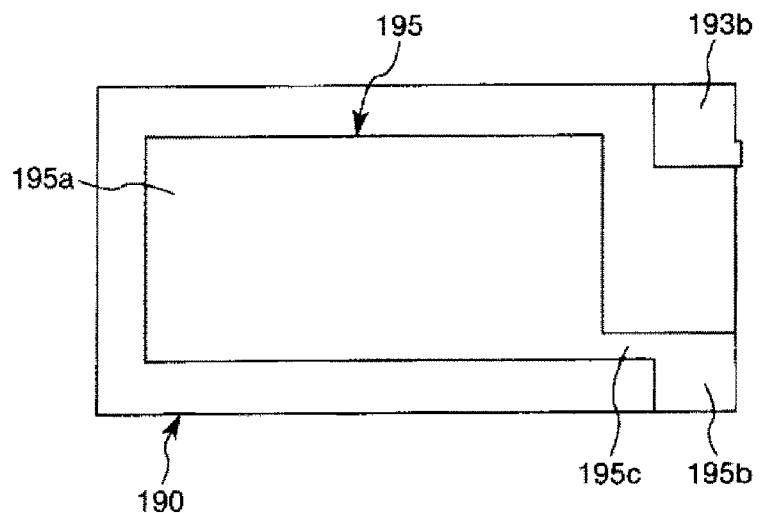

FIG. 1 is a plan view showing a vibrator to which the first embodiment of an electronic device according to the invention is applied. FIG. 2 is a cross-sectional view taken along line A-A of FIG. 1. FIGS. 3A and 3B are plan views of a vibrator element including the vibrator shown in FIG. 1. Meanwhile, hereinafter, a description will be given on the assumption that an upper side in FIG. 2 is "up" and a lower side is "down".

As shown in FIGS. 1 and 2, a vibrator 1 includes a package 110 (first embodiment of an element housing package according to the invention) and a vibrator element 190 accommodated in the package 110.

Vibrator element

As shown in FIGS. 3A and 3B, the vibrator element 190 includes a piezoelectric substrate (vibration substrate) 191 having a rectangular-plate shape when viewed in a plan view and a pair of electrode layers 193 and 195, having conductivity, which are formed on the surface of the piezoelectric substrate 191. Meanwhile, FIG. 3A is a plan view when an upper surface of the vibrator element 190 is viewed from above, and FIG. 3B is a transmission view when a lower surface of the vibrator element 190 is seen from above.

The piezoelectric substrate 191 is a quartz crystal blank plate that mainly generates a thickness shear vibration.

In this embodiment, a quartz crystal blank plate cut out at a cut angle called an AT-cut is used as the piezoelectric substrate 191. Meanwhile, the AT-cut refers to cutting-out performed to have a principal surface (principal surface including an X-axis and a Z'-axis) which is obtained by rotating a plane (Y-plane) including an X-axis and a Z-axis, which are crystal axes of a quartz crystal, counterclockwise about the X-axis from the Z-axis by approximately 35.15 degrees.

In addition, the longitudinal direction of the piezoelectric substrate 191 is coincident with the X-axis which is a crystal axis of a quartz crystal.

The electrode layer 193 includes an excitation electrode 193a formed on the piezoelectric substrate 191, a bonding pad 193b formed under the piezoelectric substrate 191, and a wiring 193c that electrically connects the excitation electrode 193a and the bonding pad 193b.

On the other hand, the electrode layer 195 includes an excitation electrode 195a formed under the piezoelectric substrate 191, a bonding pad 195b formed under the piezoelectric substrate 191, and a wiring 195c that electrically connects the excitation electrode 195a and the bonding pad 195b.

The excitation electrode 193a and the excitation electrode 195a are provided so as to face each other through the piezoelectric substrate 191 and have substantially the same shape. That is, when the piezoelectric substrate 191 is viewed in a plan view, the excitation electrode 193a and the excitation electrode 195a are located so as to overlap each other and are formed so that the outlines thereof are substantially coincident with each other.

In addition, the bonding pads 193b and 195b are formed at a right end of a lower surface of the piezoelectric substrate 191 in FIG. 3B.

Meanwhile, the quartz crystal blank plate of AT-cut has been described above as an example. However, the cut angle is not particularly limited, and a Z-cut, a BT-cut, or the like may be used. In addition, the shape of the piezoelectric substrate 191 is not particularly limited, and shapes such as a two-legged tuning fork shape, an H-shaped tuning fork shape, a three-legged tuning fork shape, a comb tooth shape, an orthogonal shape, and a rectangular column shape may be used.

In addition, a constituent material of the piezoelectric substrate 191 is not limited to quartz crystal, and may be other piezoelectric materials, silicon, or the like.

Further, the vibrator 1 may be used not only as a timing source, but also as a sensor that detects a physical quantity such as pressure, acceleration, or angular velocity.

Package

As shown in FIGS. 1 and 2, the package 110 includes a plate-shaped base 120 and a lid 130 having a concave portion 131 opened downward. In such a package 110, the concave portion 131 is closed by the base 120. Thus, a defined space inside the concave portion 131 is used as an accommodation space S that accommodates the vibrator element 190 described above. Meanwhile, FIG. 1 shows the lid 130 of which a portion is notched.

The base 120 includes a ceramic substrate 125 provided with a pair of through holes 121 and 122 passing therethrough in a thickness direction, and through electrodes 143 and 153 provided within the through holes 121 and 122. The base 120 is an example of the wiring board according to the embodiment of the invention.

Examples of a constituent material of the ceramic substrate 125 include various types of ceramics such as oxide-based ceramics, e.g., alumina, silica, titania, and zirconia, nitride-based ceramics, e.g., silicon nitride, aluminum nitride, and titanium nitride, and carbide-based ceramics, e.g., silicon carbide.

In addition, a pair of connection electrodes 141 and 151 are provided on the base 120. On the other hand, a pair of external mounting electrodes 142 and 152 are formed under the base 120.

As described above, the through electrode (through wiring) 143 is provided within the through hole 121, and the through electrode (through wiring) 153 is provided within the through hole 122. The connection electrode 141 and the external mounting electrode 142 are electrically connected to each other through the through electrode 143, and the connection electrode 151 and the external mounting electrode 152 are electrically connected to each other through the through electrode 153.

Constituent materials of the connection electrodes 141 and 151, the external mounting electrodes 142 and 152, and the through electrodes 143 and 153 are not particularly limited. Examples of the constituent materials include a single body of a metal element such as gold (Au), platinum (Pt), aluminum (Al), silver (Ag), chromium (Cr), nickel (Ni), copper (Cu), molybdenum (Mo), niobium (Nb), tungsten (W), iron (Fe), titanium (Ti), cobalt (Co), zinc (Zn), or zirconium (Zr), or an alloy or complex including the metal elements.

Meanwhile, the through electrodes 143 and 153 will be described later in detail.

In addition, an outer edge portion of an upper surface of the base 120 is provided with a frame-shaped metalized layer not shown in the drawing. The metalized layer is used to increase adhesion between the base 120 and a brazing material 180 to be described later. Thus, it is possible to increase bonding strength between the base 120 and the lid 130 by the brazing material 180.

A constituent material of the metalized layer is not particularly limited as long as it is a material capable of increasing the adhesion with the brazing material 180. The constituent material includes, for example, the metal materials described above as the constituent materials of the connection electrodes 141 and 151 and the like.

The lid 130 includes a plate-shaped base portion 133 and a frame-shaped side wall 134 which is provided under the base portion 133, and thus the above-described concave portion 131 is formed. Such a lid 130 is formed by processing, for example, a flat metal plate into a box shape.

A constituent material of the lid 130 is not particularly limited, and may be a ceramic material or a glass material. However, the constituent material is preferably a metal material having a linear expansion coefficient which approximates that of the constituent material of the base 120. Therefore, when the base 120 is a ceramic substrate, an alloy such as an Fe—Ni—Co based alloy, e.g., kovar or an alloy such as Fe—Ni based alloy, e.g., 42 alloy is preferably used as the constituent material of the lid 130.

In addition, a frame-shaped metalized layer, not shown in the drawing, is provided under the side wall 134 of the lid 130 when necessary. The metalized layer is used to increase adhesion between the lid 130 and the brazing material 180 to be described later. A constituent material of the metalized layer includes, for example, the metal materials described above as the constituent materials of the connection electrodes 141 and 151 and the like.

A method of bonding the lid 130 to the base 120 is not particularly limited, and includes, for example, a method of allowing the brazing material 180 to penetrate between the lid 130 and the base 120 by irradiating an edge portion of the lid 130 with a laser in a state where the lid 130 is mounted on the base 120 and by heating and melting the brazing material 180.

A constituent material of the brazing material 180 is not particularly limited. For example, gold solder, silver solder, and the like can be used as the constituent material, but silver solder is preferably used. In addition, a melting point of the brazing material 180 is not particularly limited, but is preferably, for example, equal to or higher than 800° C. and equal to or lower than 1000° C.

The above-described vibrator element 190 is accommodated in the accommodation space S of the package 110. The vibrator element 190 accommodated in the accommodation space S is cantilevered by the base 120 through a pair of conductivity adhesives 161 and 162.

The conductivity adhesive 161 is provided so as to come into contact with the connection electrode 141 and the bonding pad 193b, thereby electrically connecting the connection electrode 141 and the bonding pad 193b. Similarly, the conductivity adhesive 162 is provided so as to come into contact with the connection electrode 151 and the bonding pad 195b, thereby electrically connecting the connection electrode 151 and the bonding pad 195b. That is, the conductivity adhesives 161 and 162 function as a part of the electric wiring which is formed within the package 110.

Meanwhile, the conductivity adhesives 161 and 162 can be replaced with a conductive metal material. The conductive metal material is not particularly limited, but includes the metal materials described above as the constituent materials of the connection electrodes 141 and 151 and the like.

In addition, the conductivity adhesives 161 and 162 can be replaced with, for example, a bonding wire.

Here, the through electrodes 143 and 153 will be described in detail. Meanwhile, the configuration of the through electrode 143 is the same as the configuration of the through electrode 153, and thus the through electrode 143 will be described below, and the description of the through electrode 153 will be omitted.

Figure 4:
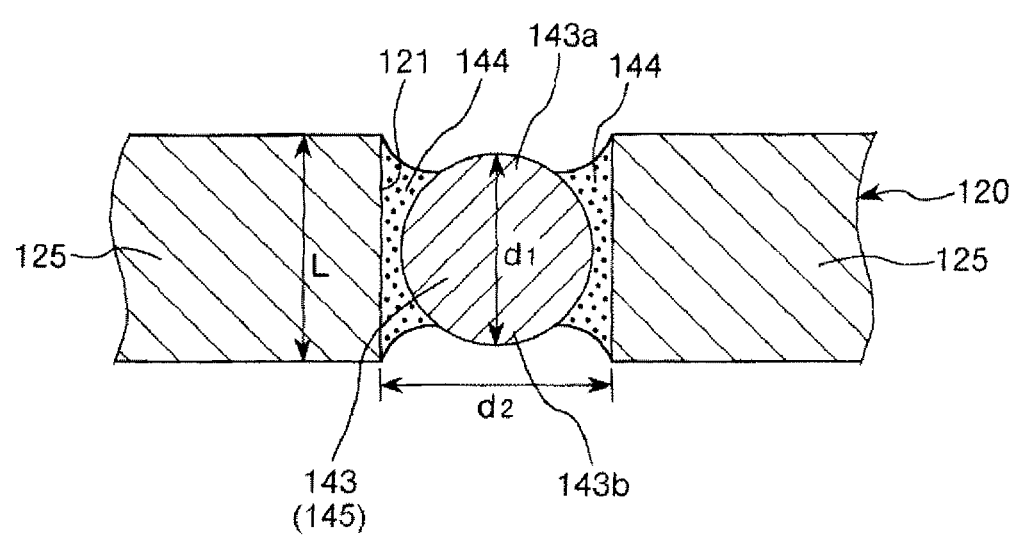
FIG. 4 is a partially enlarged view of a wiring board included in the vibrator shown in FIG. 2, according to an embodiment of the invention.

FIG. 4 is a partially enlarged view of the base (first embodiment of a wiring board according to the invention) which is included in the vibrator shown in FIG. 2. Meanwhile, the connection electrode 141, the external mounting electrode 142, and the like are not shown in FIG. 4. Meanwhile, hereinafter, description will be given on the assumption that an upper side in FIG. 4 is "up" and a lower side is "down".

The through electrode 143 is constituted by a granular conductor. In addition, a gap between the through electrode 143 and an inner surface of the through hole 121 (between the granular conductor and the base 120) is filled with a sealing portion 144. The granular conductor constituting the through electrode 143 is fixed to the through hole 121 with the sealing portion 144, and a space between two openings of the through hole 121 is airtightly sealed.

On the other hand, the sealing portion 144 is configured so that an upper end portion 143a and a lower end portion 143b of the through electrode 143 are exposed, rather than covering the entire surface of the granular conductor constituting the through electrode 143. Therefore, the upper end portion 143a and the lower end portion 143b of the through electrode 143 can electrically communicate with each other.

In addition, each of the through electrodes 143 and 153 is constituted by one granular conductor. The granular conductor is a bulk body formed of the above-described metal material, and thus has a low internal resistance and an extremely high conductivity. As a result of constituting the through electrodes 143 and 153 of such a bulky metal, the through electrodes 143 and 153 have an extremely low resistance. As a result, the vibrator 1 allows both excellent frequency characteristics and low power consumption to be achieved.

Up to now, a description has been given of the base 120 to which the first embodiment of the wiring board according to the invention is applied, and the package 110 including the base. However, the wiring board according to this embodiment of the invention is not limited thereto, and the invention can also be applied to, for example, an electric circuit board provided with an electrical circuit and an interposer substrate.

Method of Manufacturing Vibrator

Next, a method of manufacturing the vibrator 1 will be described. In addition, a method of manufacturing the base 120 will be described as a first embodiment of a method of manufacturing a wiring board according to the invention.

FIGS. 5A to 5C to FIGS. 8J to 8M are diagrams (cross-sectional views) illustrating a method of manufacturing a vibrator which includes the method of manufacturing a wiring board according to the first embodiment of the invention.

The method of manufacturing the vibrator 1 includes a process of disposing one granular conductor 145 within each of the through holes 121 and 122 of the ceramic substrate 125 provided with the through holes 121 and 122, a process of supplying a glass paste 146 into the through holes 121 and 122, a process of baking (heating) the glass paste 146, a process of forming an electrode, and a process of disposing the vibrator element 190 and the lid 130. Hereinafter, the processes will be sequentially described.

Figure 5A:
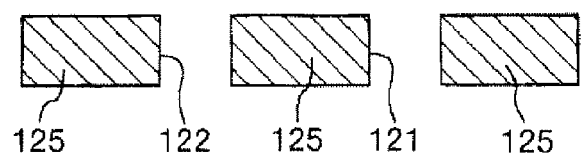
FIGS. 5A to 5C are diagrams (cross-sectional views) illustrating a method of manufacturing a vibrator which includes a method of manufacturing a wiring board, according to an embodiment of the invention.

[1] First, the ceramic substrate 125 having the through holes 121 and 122 formed therein is prepared (see FIG. 5A).

The through holes 121 and 122 can be formed by, for example, machining such as punching processing or cutting processing, laser processing, and water jet processing.

Figure 5B:
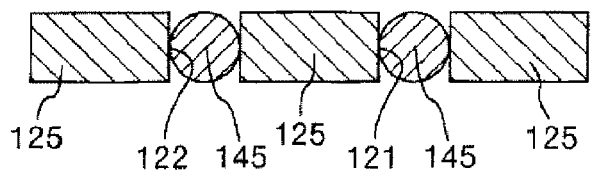

Next, as shown in FIG. 5B, one granular conductor 145 is disposed within the through holes 121 and 122.

The method of disposing the granular conductor 145 is not particularly limited. However, for example, methods of gripping one granular conductor 145 and putting the granular conductor into each of the through holes 121 and 122, of dropping the granular conductor 145 into the through holes 121 and 122 by rolling a large number of granular conductors 145 on the ceramic substrate 125, and of inducing the granular conductor 145 placed on the ceramic substrate 125 by sucking the through holes 121 and 122 from below to form a flow of air are used.

Figure 5C:
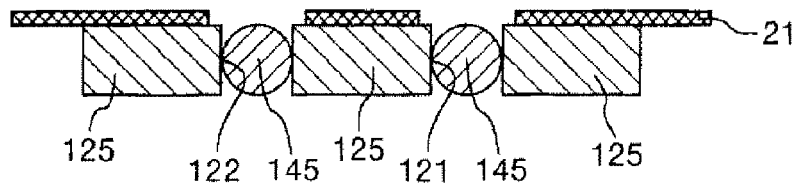

[2] Next, as shown in FIG. 5C, a mask 21 is disposed on the ceramic substrate 125. The mask 21 is a stencil mask having a window portion corresponding to a region on which the glass paste 146 is applied in a process to be described later. Here, the mask 21 having window portions at locations corresponding to the through holes 121 and 122 is used.

Figure 6D:
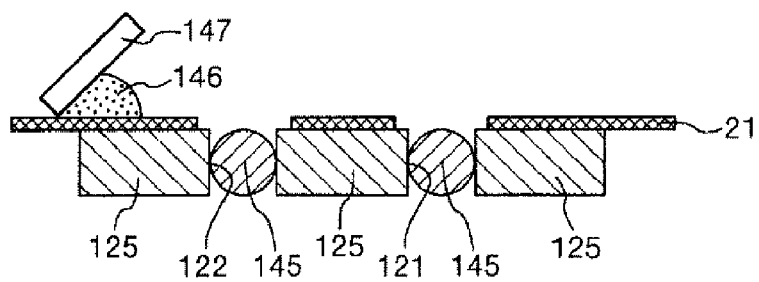
FIGS. 6D to 6F are diagrams (cross-sectional views) illustrating the method of manufacturing a vibrator which includes the method of manufacturing a wiring board according to the embodiment of the invention.

Next, as shown in FIG. 6D, the glass paste 146 is placed on the mask 21 and is then spread using a squeegee 147. Thus, the glass paste 146 enters the through holes 121 and 122. Meanwhile, since the granular conductor 145 is put into the through holes 121 and 122, the glass paste 146 is accumulated on the granular conductor 145 within the through holes 121 and 122. Then, the glass paste 146 applied in this manner contracts by being baked. Therefore, an application area of the glass paste 146 applied in this process is appropriately set on the basis of a final contraction rate.

The viscosity of the glass paste 146 is not particularly limited, but is preferably equal to or higher than 10 mPa·s and equal to or lower than 10000 mPa·s at a temperature of 23° C. and is more preferably equal to or higher than 100 mPa·s and equal to or lower than 8000 mPa·s. The viscosity of the glass paste 146 is set to be within the range, and thus a wet-spreading property of the glass paste 146 increases, thereby allowing the glass paste 146 to be more reliably put into the through holes 121 and 122. In addition, since the fluidity of the glass paste 146 is secured, a gap having a fixed size can be filled with the glass paste 146 put into the through holes 121 and 122.

Meanwhile, the viscosity of the glass paste 146 is measured in accordance with a method of measuring an apparent viscosity using a Brookfield rotating viscometer defined in JIS K 7117, and the number of rotations of a spindle during the measurement using an A-type viscometer is 20 times per minute.

Such a glass paste 146 is a liquid composition including glass powder, an organic binder, and a dispersion medium that dissolves or disperses the glass powder and the organic binder. In the glass paste 146, the dispersion medium volatilizes and the organic binder is removed through a baking process to be described later, and thus the sealing portion 144 can be formed.

In addition to the glass paste described above, for example, a glass paste that does not include a dispersion medium may be used as the glass paste 146 (liquid composition). In this case, it is possible to disperse the glass powder in the organic binder by appropriately selecting the composition of the organic binder, and thus it is possible to prepare the glass paste 146 using the glass powder and the organic binder.

In addition, the glass powder added in the glass paste 146 is not limited to being one type, and two or more types may be mixed.

For example, ethyl cellulose resin, acrylic resin, and nitrocellulosic resin may be used as the organic binder.

In addition, examples of the dispersion medium include butyl carbitol acetate, terpineol, butyl carbitol, toluene, xylene, and the like.

Further, glass powder may be used instead of the glass paste 146. The glass powder itself does not have high fluidity like the glass paste 146, but has a constant fluidity derived from the power form thereof. For this reason, it is possible to allow the glass powder to be put into the through holes 121 and 122. Similarly to the glass paste 146, it is possible to melt and solidify the glass powder through baking to be described later to thereby form the sealing portion 144.

Figure 6E:
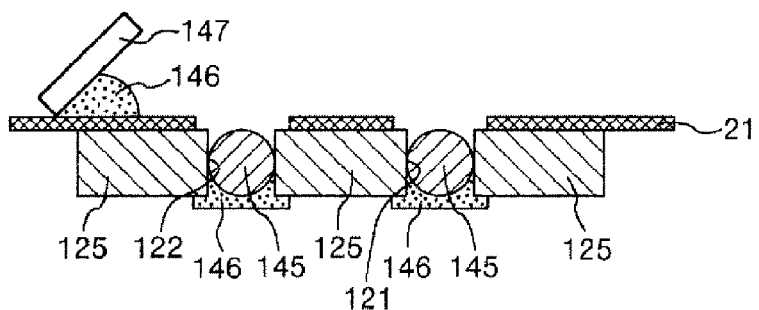
Figure 6F:
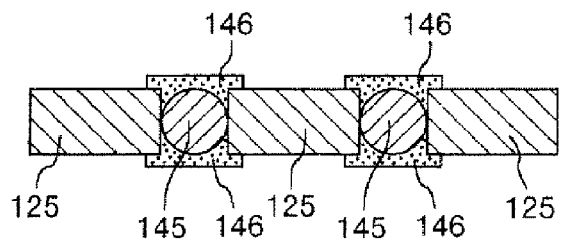

Next, the front and back of the ceramic substrate 125 are reversed, and as shown in FIG. 6E, the mask 21 is disposed again, and then the glass paste 146 is spread thereon. Thus, the glass paste 146 is accumulated on the granular conductor 145 within the through holes 121 and 122. As a result, as shown in FIG. 6F, a film constituted by the glass paste 146 is formed on and under the granular conductor 145.

Figure 7G:
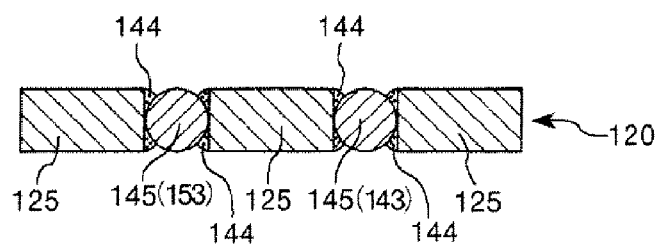
FIGS. 7G to 7I are diagrams (cross-sectional views) illustrating the method of manufacturing a vibrator which includes the method of manufacturing a wiring board according to the embodiment of the invention.

[3] Next, the ceramic substrate 125 having the glass paste 146 applied thereto is baked (heated). Thereby, the organic binder and the dispersion medium in the glass paste 146 are removed, and glass particles are sintered, and thus the sealing portion 144 shown in FIG. 7G is formed. Meanwhile, the "sintering" may be solid-phase sintering or liquid-phase sintering. Instead of the "sintering", "melting and solidification" may be used in which the glass powder is melted through heating and then the melt is solidified to thereby form the sealing portion 144.

The heating method is not particularly limited. For example, in addition to heating using a heater, heating using a laser or the like may be performed.

In addition, volume contraction occurs in connection with the baking of the glass paste 146. For this reason, as shown in FIG. 6F, the glass paste 146 protruding from the through holes 121 and 122 is contained within the through holes 121 and 122 and the upper and lower sides of the granular conductor 145 are exposed. Meanwhile, when the glass paste 146 is heated during the baking, wettability of the through holes 121 and 122 of the glass paste 146 is improved. Thus, the glass paste 146 or the melt of the glass powder penetrates into a gap between the granular conductor 145 and the through holes 121 and 122. The penetration phenomenon actively proceeds using a capillary phenomenon as a driving force thereof.

Further, the gap between the granular conductor 145 and the through holes 121 and 122 becomes smaller as a distance to a central point in a lengthwise direction of the through holes 121 and 122 in FIG. 6F becomes shorter (when the granular conductor 145 is a perfect sphere and when the diameter of the granular conductor 145 is the same as the length of each of the through holes 121 and 122). In regard to this, it is considered that the capillary phenomenon also becomes stronger as a distance to the central point in the lengthwise direction of the through holes 121 and 122 becomes shorter. Accordingly, when the glass paste 146 is baked, the glass paste 146 and the melt of the glass powder collect centering on the central point in the lengthwise direction of the through holes 121 and 122. Therefore, as the baking proceeds, the granular conductor 145 originally covered with the film of the glass paste 146 is gradually exposed. As a result, as shown in FIG. 7G, an upper end portion and a lower end portion of the granular conductor 145 are exposed, and the other regions are covered with the sealing portion 144.

In this manner, the granular conductor 145 is fixed to the through holes 121 and 122. As a result, the granular conductor 145 is changed to the through electrodes 143 and 153. Then, the base 120 (first embodiment of the wiring board according to the invention) is obtained. Meanwhile, in the base 120, electrical communication in a thickness direction can be performed by the through electrodes 143 and 153, and the airtight sealing of the through holes 121 and 122 is realized through the sealing portion 144.

Figure 7H:
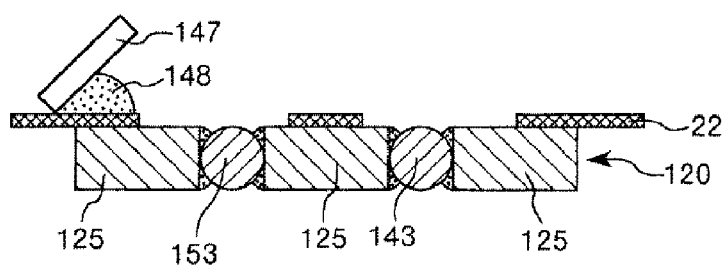

[4] Next, as shown in FIG. 7H, a mask 22 is disposed on the base 120. The mask 22 is a stencil mask having window portions corresponding to regions in which the connection electrodes 141 and 151 are formed in a process to be described later.

Next, as shown in FIG. 7H, a conductive paste 148 is placed on the mask 22 and is then spread using the squeegee 147. Thus, the film of the conductive paste 148 is formed on the through electrodes 143 and 153. At this time, as described above, upper end portions and lower end portions of the through electrodes 143 and 153 are exposed from the sealing portion 144, and thus the formed conductive paste 148 comes into contact with the through electrodes 143 and 153.

Such a conductive paste 148 is a liquid composition including powder which is a conductivity material, an organic binder, and a dispersion medium that dissolves or disperses the powder and the organic binder. In the conductive paste 148, the dispersion medium volatilizes and the organic binder is removed through a baking process to be described later, and thus a conductive film is formed.

Figure 7I:
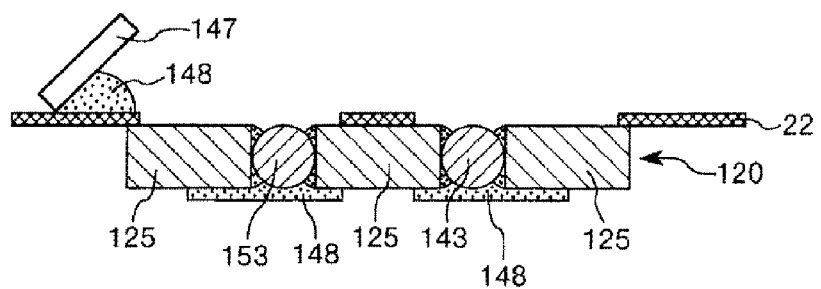

Next, the front and back of the base 120 are reversed, and as shown in FIG. 7I, the mask 22 is disposed again, and then the conductive paste 148 is spread thereon. Thus, the film of the conductive paste 148 is formed on the through electrodes 143 and 153.

Figure 8J:
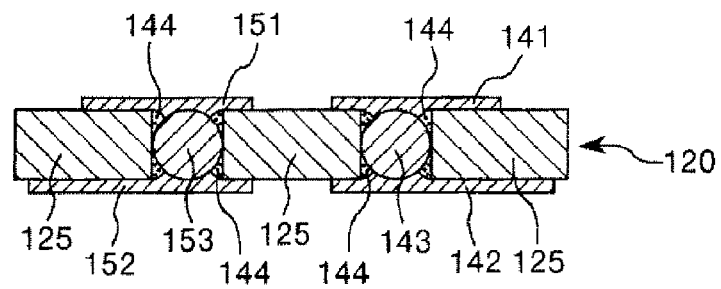

Thereafter, the ceramic substrate 125 having the film of the conductive paste 148 formed thereon is baked (heated). Thereby, the organic binder and the dispersion medium in the conductive paste 148 are removed, and the glass particles are sintered, and thus the connection electrodes 141 and 151 and the external mounting electrodes 142 and 152 are formed as shown in FIG. 8J.

Meanwhile, a method of forming the connection electrodes 141 and 151, and the external mounting electrodes 142 and 152 is not limited to the above-described method. For example, the electrodes can also be formed through various types of plating methods such as an electrolytic plating method or an electroless plating method, or various types of deposition methods such as a vacuum deposition method or a sputtering method.

Figure 8K:
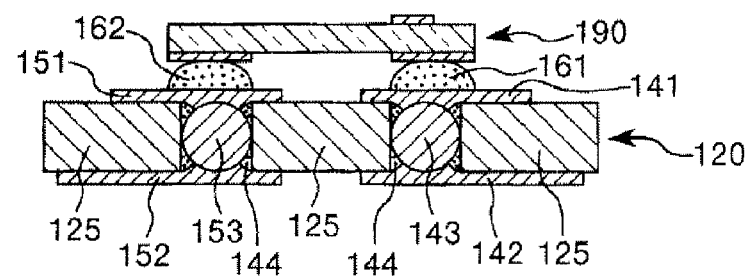
Figure 8M:
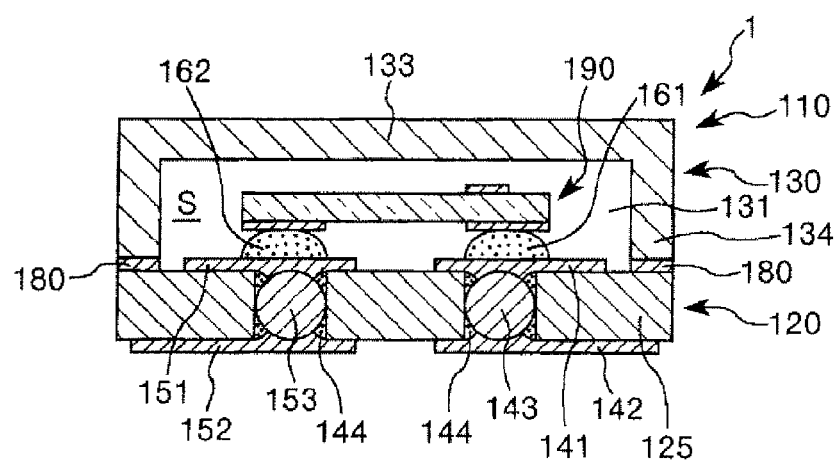

[5] Next, the conductivity adhesives 161 and 162 are mounted on the connection electrodes 141 and 151. Subsequently, as shown in FIG. 8K, the vibrator element 190 is mounted on the conductivity adhesives 161 and 162.

Next, a metalized layer, not shown in the drawing, is formed on the base 120. Similarly, a metalized layer, not shown in the drawing, is also formed on a lower end face of the side wall 134 of the lid 130. Meanwhile, the metalized layers may be formed before this process. In addition, the metalized layer may be provided when necessary, and may be omitted when a constituent material of the lid 130 is a metal material.

Next, the lid 130 is disposed on the base 120, and the base 120 is brazed to the lid 130 through the brazing material 180. Accordingly, the inside of the concave portion 131 of the lid 130 is sealed and is isolated from the outside. Thus, the vibrator 1 is obtained. At this time, the respective work environment is filled with an inert gas or is placed under reduced pressure, and thus it is possible to maintain the accommodation space S in a state of being filled with the inert gas or in a depressurized state. As a result, it is possible to suppress the aging deterioration of the vibrator element 190.

In the vibrator 1 manufactured in this manner, the through electrodes 143 and 153 are constituted by a bulky metal as described above, and thus it is possible to sufficiently reduce the electrical resistance of the through electrodes 143 and 153. For this reason, it is possible to achieve both excellent frequency characteristics and low power consumption in the vibrator 1.

In addition, since the capillary phenomenon is used in a manufacturing process of the sealing portion 144, the sealing portion can naturally penetrate into a small gap. For this reason, a gap that may serve as a ventilation path is reliably blocked by the sealing portion 144, and thus it is possible particularly to increase the airtightness of the package 110. In addition, since the sealing portion 144 is constituted by a glass material having a lower air permeability than that of an organic material, the airtightness of the package 110 is further increased.

Further, the volume of the film of the glass paste 146 changes significantly before and after the baking by using the capillary phenomenon. For this reason, even when the glass paste 146 is roughly applied so as to cover the granular conductor 145 during the application thereof, it is possible to reliably contract the glass paste 146 through baking thereafter. Thus, the upper end portion and the lower end portion of the granular conductor 145 are easily exposed. For this reason, it is possible to form a region serving as a contact point of the granular conductor 145 without performing an additional process and the like.

Therefore, the vibrator 1 according to this embodiment has frequency characteristics which are not likely to change with time, and enables a stable output to be obtained. In addition, according to the method of manufacturing a wiring board according to the invention, it is possible to efficiently manufacture the vibrator 1.

Here, in order to achieve both the above-described conductivity in the thickness direction and airtightness in the vibrator 1, it is preferable that an outer diameter of the granular conductor 145 and inner diameters of the through holes 121 and 122 are optimized in the base 120.

Specifically, as shown in FIG. 4, when a maximum diameter of the granular conductor 145 is set to $d_1$ and a minimum diameter of each of the through holes 121 and 122 is set to $d_2$, $d_1/d_2$ is preferably equal to or greater than 0.8 and equal to or less than 1, and is more preferably equal to or greater than 0.85 and equal to or less than 0.97. Here, $d_1/d_2$ is set to be within the range, and thus only one granular conductor 145 is easily disposed within the through holes 121 and 122, and there is a tendency for the upper end portion and the lower end portion of the granular conductor 145 to be exposed from the sealing portion 144. Thereby, it is possible to further increase the conductivity of the through electrodes 143 and 153. In addition, it is possible to optimize the size of the gap between the granular conductor 145 and the through holes 121 and 122, and thus the volume of the sealing portion 144 is suitable for the achievement of both mechanical strength and airtightness. For this reason, it is possible to further increase the airtightness of the through holes 121 and 122. Further, the gap between the granular conductor 145 and the through holes 121 and 122 is optimized, and the degree of the capillary phenomenon in the manufacturing process of the sealing portion 144 is particularly increased, and thus it is possible to further reliably block the ventilation path remaining within the through holes 121 and 122 and particularly to increase the airtightness of the through holes 121 and 122.

Meanwhile, when $d_1/d_2$ is less than the lower limit, the outer diameter of the granular conductor 145 becomes too small, as compared with the inner diameters of the through holes 121 and 122. Thus, the upper end portion and the lower end portion of the granular conductor 145 are not likely to be exposed from the sealing portion 144, and thus there is a concern that the conductivity between the granular conductor 145 and the connection electrodes 141 and 151 and the conductivity between the granular conductor 145 and the external mounting electrodes 142 and 152 may be decreased. On the other hand, when $d_1/d_2$ is greater than the upper limit, the outer diameter of the granular conductor 145 becomes large, as compared with the inner diameters of the through holes 121 and 122. Thus, there is a concern that the granular conductor 145 may not enter the through holes 121 and 122.

Meanwhile, the maximum diameter of the granular conductor 145 refers to a maximum diameter that can be taken in one granular conductor 145, and can be obtained as a maximum length in a projection image.

In addition, the minimum diameter of each of the through holes 121 and 122 refers to a minimum inner diameter that can be taken in a cross-section when each of the through holes 121 and 122 is cut off by a plane orthogonal to the axis thereof.

In addition, when the maximum diameter of the granular conductor 145 is set to $d_1$ and the minimum length of each of the through holes 121 and 122 is set to L, $d_1/L$ is preferably equal to or greater than 0.8 and equal to or less than 1, and is more preferably equal to or greater than 0.85 and equal to or less than 0.97. Here, $d_1/L$ is set to be within the range, and thus there is a low probability of the granular conductor 145 protruding from an upper surface and a lower surface of the ceramic substrate 125. Accordingly, the flatness of the surface of the base 120 is increased, and thus the connection electrodes 141 and 151 and the external mounting electrodes 142 and 152 are easily formed.

Meanwhile, when $d_1/L$ is less than the lower limit, the outer diameter of the granular conductor 145 becomes too small, as compared with the lengths of the through holes 121 and 122. Accordingly, the upper end portion and the lower end portion of the granular conductor 145 are not likely to be exposed from the sealing portion 144, and thus there is a concern that the conductivity between the granular conductor 145 and the connection electrodes 141 and 151 and the conductivity between the granular conductor 145 and the external mounting electrodes 142 and 152 may be decreased. On the other hand, when $d_1/L$ is greater than the upper limit, the outer diameter of the granular conductor 145 becomes too large, as compared with the lengths of the through holes 121 and 122. Thus, there is a concern that the granular conductor 145 may protrude from the through holes 121 and 122.

Meanwhile, the minimum length of each of the through holes 121 and 122 refers to a minimum length that can be taken by each of the through holes 121 and 122.

In addition, the maximum diameter $d_1$ of the granular conductor 145 is appropriately set depending on both the minimum diameter $d_2$ and the minimum length L of each of the through holes 121 and 122, but is preferably equal to or greater than 20 µm and equal to or less than 2000 µm and is more preferably equal to or greater than 50 µm and equal to or less than 1000 µm.

In addition, when a volume of each of the through holes 121 and 122 is set to $V_1$ and a volume of the granular conductor 145 is set to $V_2$, a volume of the glass paste 146 supplied to the through holes 121 and 122 is preferably smaller than $V_1-V_2$ and is more preferably smaller than $0.9\times(V_1-V_2)$. The volume of the glass paste 146 is set to be within the range, and thus there is a tendency for the upper end portion and the lower end portion of the granular conductor 145 to be exposed from the sealing portion 144. Accordingly, it is possible to further increase the conductivity between the granular conductor 145 and the connection electrodes 141 and 151 and the conductivity between the granular conductor 145 and the external mounting electrodes 142 and 152.

In addition, the glass powder included in the glass paste 146 may be any powder as long as the constituent material thereof is a glass material. However, the constituent material is preferably a glass material including $B_2O_3$ and $SiO_2$. Particularly, the constituent material is more preferably any one of silica glass, borosilicate glass, and zinc phosphate glass, and is further preferably borosilicate glass. Such a glass material has a relatively high adhesion with a metal material and a ceramic material and has a low air permeability. For this reason, it is possible to obtain the package 110 having a high airtightness by using the glass paste 146 including such a glass material. In addition, since the glass material has a sufficient fluidity when being melted, there is a tendency for a sufficient driving force to be generated due to the capillary phenomenon, and thus it is possible to more reliably block the ventilation path remaining within the through holes 121 and 122.

Meanwhile, the glass powder may further include ZnO, PbO, $Li_2O$, $Na_2O$, $K_2O$, MgO, CaO, SrO, BaO, $Bi_2O_3$, $Al_2O_3$, $Gd_2O_3$, $Y_2O_3$, $La_2O_3$, $Yb_2O_3$, and the like.

On the other hand, when an average particle size of the glass powder included in the glass paste 146 is set to $d_3$ and a minimum diameter of each of the through holes 121 and 122 is set to $d_2$, $d_3/d_2$ is preferably equal to or greater than 0.005 and equal to or less than 0.02 and is more preferably equal to or greater than 0.007 and equal to or less than 0.015. Here, $d_3/d_2$ is set to be within the range, and thus it is possible to put an appropriate amount of glass powder into the through holes 121 and 122. For this reason, when the glass paste 146 is baked, there is a tendency for the glass paste 146 and the melt of the glass powder to penetrate a gap between the granular conductor 145 and the through holes 121 and 122, and thus the blocking of the ventilation path using the capillary phenomenon as a driving force becomes more conspicuous.

Meanwhile, the average particle size of the glass powder can be obtained as an average value of the diameters of circles having the same areas as projection images (diameters equivalent to projection area circles) which are observed with respect to one hundred glass particles.

In addition, a thermal expansion coefficient of the glass powder (sealing portion 144) which is included in the glass paste 146 is preferably equal to or greater than $2\times10^{-6}$ [/° C.] and equal to or less than $15\times10^{-6}$ [/° C.], and a thermal expansion coefficient of the granular conductor 145 (through electrodes 143 and 153) is preferably equal to or greater than $4\times10^{-6}$ [/° C.] and equal to or less than $20\times10^{-6}$ [/° C.]. The thermal expansion coefficients of the glass powder and the granular conductor 145 are set to be in the range. Accordingly, even when a change in temperature occurs in the base 120, a gap is not likely to be generated between the granular conductor 145 and the through holes 121 and 122. Thus, it is possible to suppress a decrease in the airtightness of the package 110 due to the change in temperature.

Meanwhile, the thermal expansion coefficients are within a temperature range of 30° C. to 300° C.

In addition, the average particle size $d_3$ of the glass powder is preferably equal to or greater than 0.1 µm and equal to or less than 20 µm and is more preferably equal to or greater than 0.3 µm and equal to or less than 10 µm. When the average particle size $d_3$ of the glass powder is less than the lower limit, there is a tendency for the glass powder to be aggregated although it depends on the constituent material of the glass powder and the size of the gap, and thus the glass powder is not likely to enter a small gap. On the other hand, when the average particle size $d_3$ of the glass powder is greater than the upper limit, the glass powder is not likely to enter the gap although it depends on the constituent material of the glass powder and the size of the gap.

In addition, a glass transition point of the glass powder is not particularly limited, but is preferably equal to or higher than 250° C. and equal to or lower than 570° C. and is more preferably equal to or higher than 300° C. and equal to or lower than 500° C.

Further, a softening point of the glass powder is not particularly limited, but is preferably equal to or higher than 300° C. and equal to or lower than 650° C. and is more preferably equal to or higher than 300° C. and equal to or lower than 600° C.

When heat characteristics of the glass powder are within the above-described range, the glass powder has a sufficient fluidity when glass is melted, and a thermal effect on the granular conductor 145 and the ceramic material is suppressed at the time of heating. Accordingly, this is effective from the viewpoint of achieving both the conductivity and airtightness of the through electrodes 143 and 153.

In addition, for example, the above-described constituent materials of the connection electrodes 141 and 151 are used as a constituent material of the granular conductor 145 when priority is given to conductivity. On the other hand, when a thermal expansion difference from the ceramic substrate 125 is considered, an Fe—Ni—Co based alloy or an Fe—Ni based alloy is preferably used. Since the alloys have a thermal expansion coefficient which particularly approximates that of the ceramic material, a gap is not particularly likely to be generated between the granular conductor 145 and the through holes 121 and 122. For this reason, for example, even when a thermal shock is applied to the vibrator 1, it is possible to continuously maintain the conductivity and airtightness of the through electrodes 143 and 153. As a result, the vibrator 1 having a high reliability even under severe environments is obtained.

Meanwhile, a portion of the inside of the granular conductor 145 may be formed of a non-conductive material. Examples of the non-conductive material include a ceramic material, a glass material, an organic material, a non-conductive metal material, and the like.

In addition, the surface of the granular conductor 145 may be coated with a conductive material. The conductive material includes the above-described constituent materials of the connection electrodes 141 and 151, and the like. In addition, a material having excellent weather resistance is used as the conductive material, and thus it is possible to increase weather resistance without reducing the conductivity of the granular conductor 145 too much. Examples of the material having excellent weather resistance include a single body of gold, platinum, titanium, aluminum, magnesium, and the like, or a compound or mixture thereof.

In addition, the shape of the granular conductor 145 does not necessarily have to be a perfect spherical shape and only need be a grain shape. For example, the shape may be a spherical shape like a spheroid, may be a trapezoidal rotator obtained by rotating a trapezoid about an axis that vertically divides an upper base and a lower base into two parts, a columnar body such as a column or a rectangular column, a cone such as a circular cone or a pyramid, or various types of polyhedrons, or may be any different shape. However, in consideration of the probability of the occurrence of a capillary phenomenon, the shape of the sealing portion 144 depending on the shape of the granular conductor 145, the easiness of the arrangement of the granular conductor 145 with respect to the through holes 121 and 122, and the like, the shape of the granular conductor 145 is preferably a spherical shape and is more preferably a shape which is close to a perfect spherical shape. Particularly, when the glass powder is sintered or is melted and solidified, volume contraction occurs. At this time, it is considered that contraction occurs in such a manner that the glass powder gathers in a region where a capillary phenomenon is occurring. The granular conductor 145 has a spherical shape, and thus a cross-sectional area of the gap between the granular conductor 145 and the inner walls of the through holes 121 and 122, which is filled with the glass powder, necessarily becomes smaller by gradation toward the region where the capillary phenomenon occurs. For this reason, there is a tendency for the melted glass powder to sequentially fill from the back of the gap, and thus it is possible to form the sealing portion 144 particularly having an excellent airtightness.

Meanwhile, the sealing portion 144 is appropriately set depending on the shapes of the through holes 121 and 122 and the granular conductor 145. The shape of the sealing portion 144 is not particularly limited, but is preferably an annular shape and is more preferably a toric shape. When the sealing portion 144 has such a shape, there is a tendency for the upper end portion and the lower end portion of the granular conductor 145 to be exposed while filling the gap between the granular conductor 145 and the through holes 121 and 122. For this reason, the through electrodes 143 and 153 can more reliably achieve both conductivity and airtightness.

In addition, when the sealing portion 144 has an annular shape, both ends thereof in an axial direction are positioned at both openings of the through holes 121 and 122.

Figure 9A:
FIG. 9A shows an example of an observation image obtained by observing a cross-section of a sample of a base (first embodiment of a wiring board according to the invention) which is included in the vibrator shown in FIG. 2 by using a scanning electron microscope.
Figure 9B:
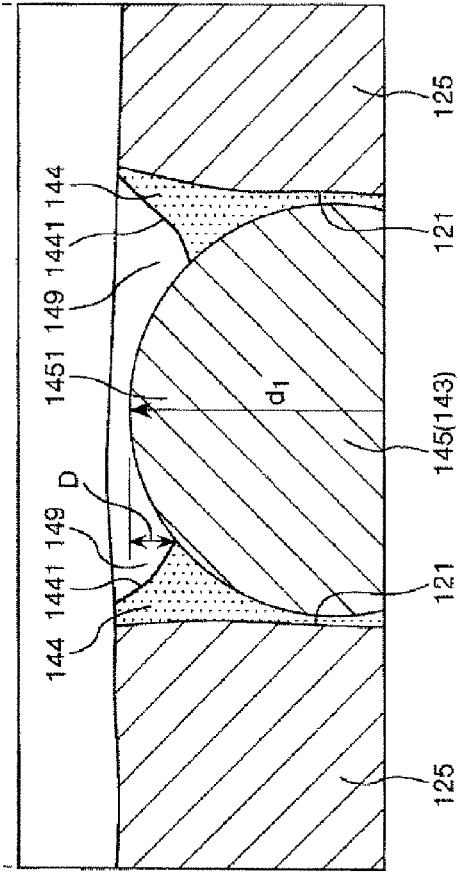
FIG. 9B is a schematic diagram of portions which are read from the observation image shown in FIG. 9A.

FIG. 9A shows an example of an observation image obtained by observing a cross-section of a sample of the base (first embodiment of the wiring board according to the invention) which is included in the vibrator shown in FIG. 2 by using a scanning electron miscroscope, and FIG. 9B is a schematic diagram of portions which are read from the observation image shown in FIG. 9A.

As shown in FIGS. 9A and 9B, the sealing portion 144 is provided to fill the gap between the through hole 121 and the granular conductor 145, and has an annular shape (tubular shape) which is long in an axial direction (vertical direction in FIGS. 9A and 9B).

In addition, the granular conductor 145 is surrounded by the sealing portion 144, and an upper end portion (a portion) 1451 thereof is exposed from the sealing portion 144.

Further, in the sealing portion 144 shown in FIGS. 9A and 9B, the upper end thereof is formed as an inclined surface 1441 that connects an upper surface of the ceramic substrate 125 and the surface of the granular conductor 145. In addition, the connection location between the inclined surface 1441 and the surface of the granular conductor 145 is positioned below an upper end of the granular conductor 145. In the granular conductor 145, a portion positioned above the connection location is equivalent to the upper end portion 1451 which is exposed from the sealing portion 144 described above.

Here, the inclined surface 1441 of the sealing portion 144 shown in FIGS. 9A and 9B is configured to descend toward the upper end portion 1451 of the granular conductor 145 from the upper surface of the ceramic substrate 125. For this reason, an annular concave portion 149 which is shaped by the inclined surface 1441 and the upper end portion 1451 is formed in a gap between the inner surface of the through hole 121 and the granular conductor 145. In other words, a concave portion 149 having an annular shape is provided so as to surround the upper end portion 1451 of the granular conductor 145, and is recessed further than the upper end portion 1451 of the granular conductor 145 in the thickness direction of the ceramic substrate 125.

Such a concave portion 149 having an annular shape is provided, and thus it is possible to further increase the adhesion of the through electrode 143 with respect to each of the connection electrode 141 and the external mounting electrode 142, for example, when the connection electrode 141 and the external mounting electrode 142 are formed so as to be electrically connected to the through electrode 143 (granular conductor 145) as shown in FIG. 2. Thus, it is possible to achieve a reduction in the connection resistance of the through electrode 143 with respect to the connection electrode 141 and the external mounting electrode 142 and to further increase the conductivity of the base 120. Meanwhile, it is considered that such effects are obtained because an action occurs in which the connection electrode 141 and the external mounting electrode 142 grip the upper end portion 1451 of the granular conductor 145 by the concave portion 149, having an annular shape, provided so as to surround the vicinity of the upper end portion 1451 of the granular conductor 145 and by the connection electrode 141 and the external mounting electrode 142 put into the concave portion 149. Particularly, when the volume contraction of a material occurs at the time of forming the connection electrode 141 and the external mounting electrode 142, the gripping action acts more strongly, and thus is considered to contribute to the improvement in adhesion. In addition, a so-called anchor effect occurs between the concave portion 149 having an annular shape, the connection electrode 141, and the external mounting electrode 142, and thus adhesion is considered to be increased.

Further, the inclined surface 1441 of the sealing portion 144 and the upper end portion 1451 of the granular conductor 145 are exposed to the concave portion 149 having an annular shape. For this reason, when the connection electrode 141 and the external mounting electrode 142 are put into the concave portion 149, the electrodes come into contact with both the inclined surface 1441 and the upper end portion 1451. Thus, for example, even when the granular conductor 145 expands or contracts due to the influence of temperature or the like, stress is not likely to be concentrated at a specific location, and thus it is possible to suppress the release of the connection state between the granular conductor 145, the connection electrode 141, and the external mounting electrode 142.

Meanwhile, the inclined surface 1441 can be easily formed by utilizing the contraction of the constituent material when the sealing portion 144 is formed. When the inclined surface 1441 is formed through such a process, there is a tendency for the inclined surface 1441 to be changed to a curved surface, referred to as a so-called fillet, which is curved to be convex downwardly in FIGS. 9A and 9B. In the inclined surface 1441 having such a curved surface, the volume of the bottom of the concave portion 149 can be increased, as compared with a curved surface which is curved to be convex upwardly in FIGS. 9A and 9B. For this reason, the volumes of the connection electrode 141 and the external mounting electrode 142 which are put into the concave portion 149 are increased, and thus it is possible to further enhance an action in which the upper end portion 1451 of the granular conductor 145 is gripped by the connection electrode 141 and the external mounting electrode 142.

The depth of the concave portion 149 is not particularly limited. However, when the distance between the top portion of the upper end portion 1451 of the granular conductor 145 and the deepest portion of the concave portion 149 is set to D, $D/d_1$ is preferably equal to or greater than approximately 0.02 and equal to or less than approximately 0.3 and is more preferably equal to or greater than approximately 0.05 and equal to or less than approximately 0.25. The depth of the concave portion 149 is set to be within the range, and thus a sufficient depth for the connection electrode 141 and the external mounting electrode 142 to grip the upper end portion 1451 of the granular conductor 145 is secured, and the thickness of the sealing portion 144 is also secured. Thus, it is possible to secure a sufficient airtightness. Therefore, when the depth of the concave portion 149 is below the lower limit, it is not possible to secure a sufficiently wide contact range between the upper end portion 1451 of the granular conductor 145, and the connection electrode 141 and the external mounting electrode 142. Thus, there is a concern that adhesion may be reduced depending on the size of the granular conductor 145 and that conductivity may not be sufficiently increased. On the other hand, when the depth of the concave portion 149 is greater than the upper limit, the thickness of the sealing portion 144 becomes smaller to that extent. Thus, there is a concern that the airtightness of the base 120 may not be sufficiently increased depending on the size of the gap between the inner surface of the through hole 121 and the granular conductor 145.

Second Embodiment

Next, a second embodiment of an electronic device according to the invention, a second embodiment of an element housing package according to the invention, and a second embodiment of a wiring board according to the invention will be described.

Figure 10:
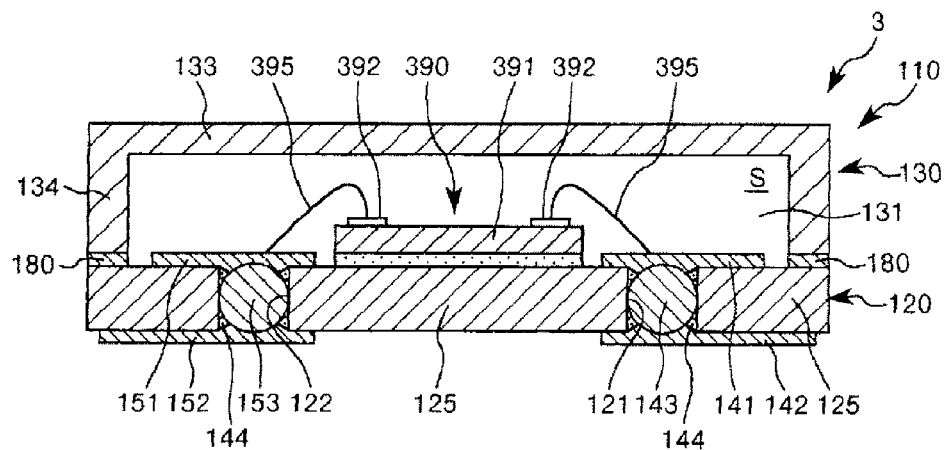
FIG. 10 is a cross-sectional view showing a semiconductor device to which an electronic device according to a second embodiment of the invention is applied.

FIG. 10 is a cross-sectional view showing a semiconductor device to which the second embodiment of the electronic device according to the invention is applied. Meanwhile, in the following description, an upper side in FIG. 10 will be referred to as "up" and a lower side is referred to as "down".

Hereinafter, the second embodiment will be described. However, a description will be given below focusing on the differences from the first embodiment, and the description of the same matters will be omitted. In the drawings, the same matters as those in the above-described embodiment will be denoted by the same reference numerals.

As shown in FIG. 10, a semiconductor device 3 includes a package 110 (second embodiment of the element housing package according to the invention) and a semiconductor element 390 which is accommodated in the package 110.

The semiconductor element 390 is an element formed of any of various types of semiconductor materials such as silicon, silicon carbide, gallium nitride, and gallium arsenide, and may be any element. For example, the semiconductor element 390 may be an active element such as an integrated circuit device (IC), a large-scale integrated circuit element (LSI), and a charge-coupled device (CCD), or may be a passive element such as a resistor or a capacitor. In addition, the plurality of semiconductor elements 390 or a mixture of one semiconductor element 390 and another element may be included within one package 110.

Such a semiconductor element 390 has a tendency to be easily influenced by moisture, foreign substances, or the like particularly when being built in a high-frequency circuit. For this reason, the semiconductor element 390 is accommodated in the package 110 having a high airtightness, and thus it is possible to achieve an improvement in the reliability of the semiconductor device 3.

Such a semiconductor element 390 includes an element main body 391 and two pads 392 and 392 provided on the upper surface of the element main body 391.

Similarly to the first embodiment, the package 110 includes a base 120 and a lid 130. In addition, the base 120 includes a ceramic substrate 125, through electrodes 143 and 153, connection electrodes 141 and 151, and external mounting electrodes 142 and 152.

The two pads 392 and 392 of the semiconductor element 390 are electrically connected to the connection electrodes 141 and 151 through bonding wires 395, respectively.

Also in such a semiconductor device 3, the same operations and effects as those of the vibrator 1 according to the first embodiment are obtained. That is, the base 120 has a high conductivity of a through wiring and a high airtightness. For this reason, according to the method of manufacturing a wiring board according to the invention, it is possible to obtain the package 110 and the semiconductor device 3 which have a high reliability.

Electronic Apparatus

Next, an electronic apparatus (electronic apparatus according to the invention) which includes the electronic device according to the invention will be described in detail with reference to FIGS. 11 to 13.

Figure 11:
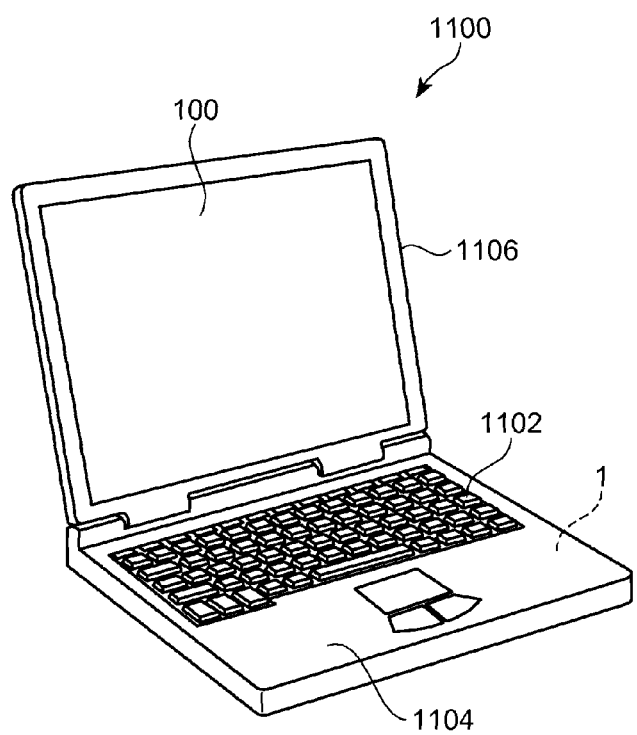
FIG. 11 is a perspective view showing the configuration of a mobile (or notebook) personal computer to which an electronic apparatus including the electronic device according to the invention is applied.

FIG. 11 is a perspective view showing the configuration of a mobile (or notebook) personal computer to which an electronic apparatus including the electronic device according to the invention is applied. In FIG. 11, a personal computer 1100 is configured to include a main body 1104 having a keyboard 1102 and a display unit 1106 having a display portion 100, and the display unit 1106 is supported so as to be rotatable with respect to the main body 1104 through a hinge structure. The vibrator 1 functioning as a filter, a resonator, a reference clock, and the like is provided in the personal computer 1100.

Figure 12:
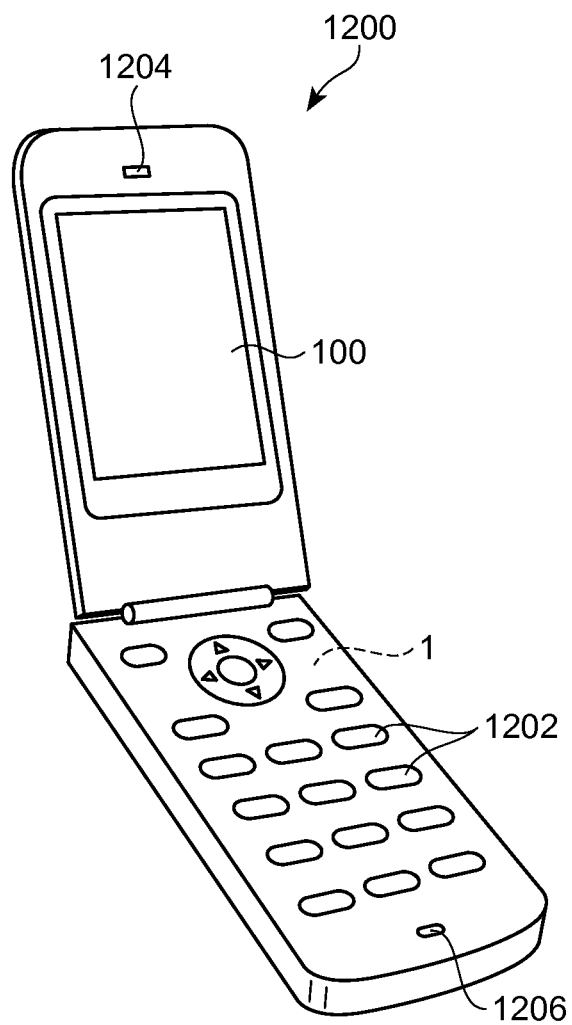
FIG. 12 is a perspective view showing the configuration of a mobile phone (PHS is also included) to which the electronic apparatus including the electronic device according to the invention is applied.

FIG. 12 is a perspective view showing the configuration of a mobile phone (PHS is also included) to which the electronic apparatus including the electronic device according to the invention is applied. In FIG. 12, a mobile phone 1200 includes a plurality of operation buttons 1202, an earpiece 1204, and a mouthpiece 1206, and the display portion 100 is disposed between the operation buttons 1202 and the earpiece 1204. The vibrator 1 functioning as a filter, a resonator, and the like is built in the mobile phone 1200.

Figure 13:
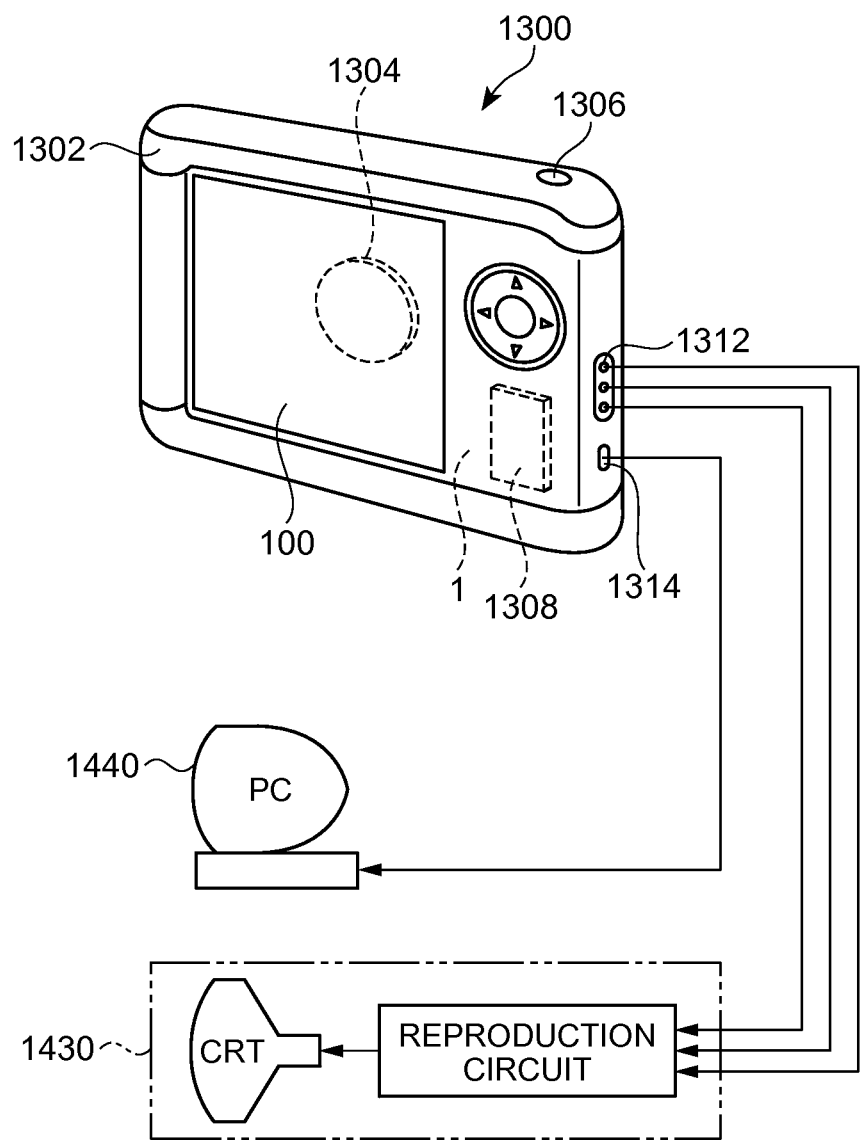
FIG. 13 is a perspective view showing the configuration of a digital still camera to which the electronic apparatus including the electronic device according to the invention is applied.

FIG. 13 is a perspective view showing the configuration of a digital still camera to which the electronic apparatus including the electronic device according to the invention is applied. Meanwhile, connection with an external device is simply shown in FIG. 13. Here, a silver halide photograph film is exposed to light according to an optical image of a subject in a typical camera, while a digital still camera 1300 generates an imaging signal (image signal) by performing photoelectric conversion of an optical image of a subject using an imaging element, such as a charge coupled device (CCD).

A display portion is provided on the back of a case (body) 1302 in the digital still camera 1300, so that display based on the imaging signal of the CCD is performed. The display portion functions as a viewfinder that displays a subject as an electronic image. In addition, a light receiving unit 1304 including an optical lens (imaging optical system), a CCD, and the like is provided on the front side (back side in FIG. 13) of the case 1302.

When a photographer checks a subject image displayed on the display unit and presses a shutter button 1306, an imaging signal of the CCD at that point in time is transferred and stored in a memory 1308. In addition, in the digital still camera 1300, a video signal output terminal 1312 and an input/output terminal for data communication 1314 are provided on the side surface of the case 1302. In addition, as shown in FIG. 13, a television monitor 1430 is connected to the video signal output terminal 1312 and a personal computer 1440 is connected to the input/output terminal for data communication 1314 when necessary. In addition, an imaging signal stored in the memory 1308 may be output to the television monitor 1430 or the personal computer 1440 by a predetermined operation. The vibrator 1 that functions as a filter, a resonator, and the like is built in the digital still camera 1300.

Meanwhile, the electronic apparatus including the electronic device according to the invention can be applied not only to the personal computer (mobile personal computer) shown in FIG. 11, the mobile phone shown in FIG. 12, and the digital still camera shown in FIG. 13 but also to an ink jet type discharge apparatus (for example, an ink jet printer), a laptop type personal computer, a television, a video camera, a video tape recorder, a car navigation apparatus, a pager, an electronic organizer (an electronic organizer with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, instruments (for example, instruments for vehicles, aircraft, and ships), and a flight simulator.

Moving Object

Next, a moving object (moving object according to the invention) which includes the electronic device according to the invention will be described.

Figure 14:
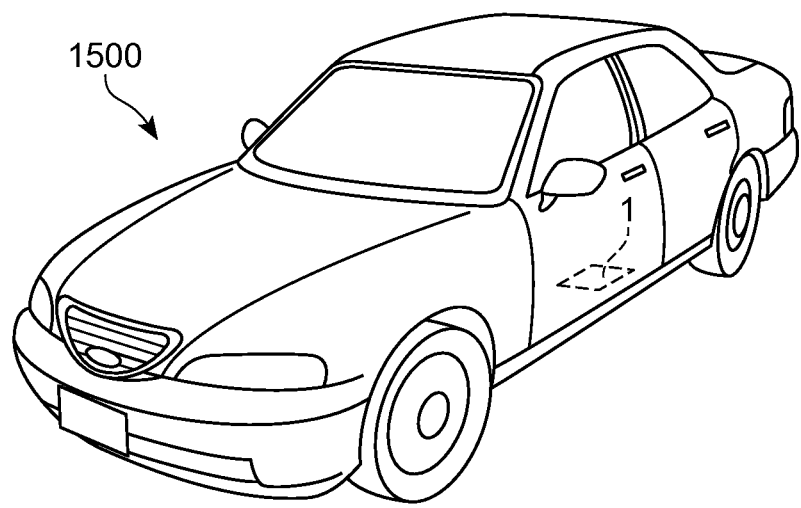
FIG. 14 is a schematic perspective view showing a vehicle as an example of a moving object according to the invention.

FIG. 14 is a schematic perspective view showing a vehicle as an example of the moving object according to the invention. The vibrator 1 is mounted in a vehicle 1500. The vibrator 1 can be widely applied to an electronic control unit (ECU), such as a keyless entry, an immobilizer, a car navigation system, a car air-conditioner, an anti-lock brake system (ABS), an airbag, a tire pressure monitoring system (TPMS), an engine control, a battery monitor of a hybrid vehicle or an electric vehicle, and a vehicle body position control system.

While the invention has been described with reference to the preferred embodiments, the invention is not limited thereto, and the configuration of each portion may be replaced with an arbitrary configuration having the same function.

For example, an element accommodated in the above-described element housing package is not limited to a vibrator element or a semiconductor element, and may be any functional element such as an optical element, an electric element, an electronic element, a mechanical element (MEMS is also included), a thermal element, and a chemical element.

In the invention, an arbitrary component may be added to the above-described embodiments, and the embodiments may be appropriately combined with each other.

EXAMPLE

Next, a specific example of the invention will be described.
1. Manufacture of Sample Example 1

[1] First, a ceramic substrate having four through holes formed therein was prepared, and one spherical conductor was disposed within each of the through holes. At this time, a lower surface side of the ceramic substrate was depressurized and a large number of spherical conductors were supplied to an upper surface side thereof so that the arrangement of the spherical conductors in the through holes was induced. Hereinafter, conditions of the ceramic substrate and the spherical conductor are listed. Meanwhile, a metalized layer was formed in advance in the prepared ceramic substrate along the outer edge portion thereof.

Conditions of Ceramic Substrate
    Material: alumina
    Size: 10 mm (vertical)×10 mm (horizontal)
    The number of through holes: four
    Minimum diameter of through hole: 210 μm
    Minimum length of through hole: 200 μm
    Volume of through hole: $7.21\times10^{-3}$ mm$^3$ ($V_1$)
    Thermal expansion coefficient: $6.9\times10^{-6}$/° C.
Conditions of Spherical Conductor
    Material: Cu
    Maximum diameter: 200 μm
    Volume: $3.94\times10^{-3}$ mm$^3$ ($V_2$)
    Thermal expansion coefficient: $16.7\times10^{-6}$/° C.

[2] Next, a mask was disposed on the ceramic substrate, and a glass paste (liquid composition) was applied thereto. Subsequently, the ceramic substrate was reversed, and a mask was disposed thereon again, and then a glass paste was applied thereto. Hereinafter, conditions of the used glass paste are listed.

Conditions of Glass Paste
    Constituent material of glass powder: $ZnO.B_2O_3.SiO_2$ based glass
    Thermal expansion coefficient of glass powder: $7\times10^{-6}$/° C.
    Average particle size of glass powder: 1.5 μm
    Volume of glass paste: less than $V_2-V_1$

[3] Next, the ceramic substrate having the glass paste applied thereto was baked. Thus, glass particles were sintered to thereby obtain a sealing portion.

Here, when the sealing portion was observed, it was seen that the sealing portion was recessed further than the top portion of the spherical conductor. Consequently, a distance (depth of the concave portion) between a deepest portion of the concave portion and the top portion of the spherical conductor in the thickness direction of the ceramic substrate was obtained.

Conditions of Sealing Portion
  Depth of concave portion: 25 μm

[4] Next, a mask was disposed on the ceramic substrate, and a conductive paste (Cu paste) was applied thereto. Subsequently, the ceramic substrate was reversed, and a mask was disposed thereon again, and then a conductive paste was applied thereto. Then, the applied conductive paste was baked to thereby form an electrode and the like. In this manner, a sample including a through electrode was obtained.

Example 2

A sample including a through electrode was obtained in the same manner as in Example 1 except that the material of the spherical conductor was changed to an Fe—Ni alloy. Meanwhile, conditions of the spherical conductor are as follows.
Conditions of Spherical Conductor
  Material: Fe—Ni alloy (42 alloy)
  Maximum diameter: 180 μm
  Volume: $2.87 \times 10^{-3}$ mm$^3$
  Thermal expansion coefficient: $4.8 \times 10^{-3}$/° C.

Example 3

A sample including a through electrode was obtained in the same manner as in Example 1 except that the constituent material of the glass powder was changed to the following glass. Meanwhile, conditions of a glass paste are as follows.
Conditions of Glass Paste
  Constituent material of glass powder: $SiO_2.B_2O_3.Na_2O.Al_2O_3$ based glass
  Thermal expansion coefficient of glass powder: $3 \times 10^{-3}$/° C.
  Average particle size of glass powder: 1.5 μm Examples 4 to 13

A sample including a through electrode was obtained in the same manner as in Example 1 except that the conditions of the ceramic substrate, the spherical conductor, the concave portion, and the glass powder were changed as shown in Table 1.

Example 14

A sample including a through electrode was obtained in the same manner as in Example 1 except that the material of the spherical conductor was changed to an Fe—Ni—Co alloy. Meanwhile, conditions of the spherical conductor are as follows.
Conditions of Spherical Conductor
  Material: Fe—Ni—Co alloy (kovar)
  Maximum diameter: 205 μm
  Volume: $4.25 \times 10^{-3}$ mm$^3$
  Thermal expansion coefficient: $4.7 \times 10^{-3}$/° C.

Examples 15 to 20

A sample including a through electrode was obtained in the same manner as in Example 1 except that the conditions of the ceramic substrate, the spherical conductor, the concave portion, and the glass powder were changed as shown in Table 1.

Examples 21 to 24

A sample including a through electrode was obtained in the same manner as in Example 1 except that the conditions of the ceramic substrate, the spherical conductor, the concave portion, and the glass powder were changed as shown in Table 1.

Example 25

A sample including a through electrode was obtained in the same manner as in Example 1 except that glass powder was used instead of a glass paste and the work of spreading over glass powder was performed instead of a work of applying a glass paste.

Examples 26 to 28

A sample including a through electrode was obtained in the same manner as in Example 25 except that the conditions of the ceramic substrate, the spherical conductor, the concave portion, and the glass powder were changed as shown in Table 1.

Comparative Example 1

A sample including a through electrode was obtained in the same manner as in Example 1 except that a process of filling up a through hole with a conductive paste (Cu paste) and performing baking was performed instead of the processes [1] to [3]. Meanwhile, an average particle size of Cu powder in a conductive paste was 2.5 μm.

Comparative Example 2

A sample including a through electrode was obtained in the same manner as in Example 1 except that two or more spherical conductors, that is, metal powder having a sufficiently small average particle size, as compared with a minimum diameter of a through hole, were disposed so as to be put into the through hole. Conditions of the used spherical conductor are listed below.
Conditions of Spherical Conductor
  Material: Cu
  Maximum diameter: 30 μm
  Volume: $1.33 \times 10^{-5}$ mm$^3$
  Thermal expansion coefficient: $16.7 \times 10^{-6}$/° C.

Comparative Example 3

A sample including a through electrode was obtained in the same manner as in Example 2 except that two or more spherical conductors, that is, an extremely fine metal powder, as compared with a minimum diameter of a through hole, were disposed so as to be put into the through hole. Conditions of the used spherical conductor are listed below.
Conditions of Spherical Conductor
  Material: Fe—Ni alloy (42 alloy)
  Maximum diameter: 40 μm
  Volume: $3.15 \times 10^{-5}$ mm$^3$
  Thermal expansion coefficient: $4.8 \times 10^{-3}$/° C.

Comparative Example 4

A sample including a through electrode was obtained in the same manner as in Example 2 except that two or more spherical conductors, that is, an extremely small metal powder, as compared with a minimum diameter of a through hole, were disposed so as to be put into the through hole. Conditions of the used spherical conductor are listed below.

Conditions of Spherical Conductor
 Material: Fe—Ni—Co alloy (kovar)
 Maximum diameter: 50 μm
 Volume: $6.16 \times 10^{-5}$ mm$^3$
 Thermal expansion coefficient: $4.7 \times 10^{-3}/°$ C.

Comparative Example 5

A sample including a through electrode was obtained in the same manner as in Example 1 except that one spherical conductor was disposed so as to be pressed into a through hole. Conditions of the used spherical conductor are shown in Table 1.

As described above, the manufacturing conditions of the samples including a through electrode according to the examples and the comparative examples are shown in Tables 1 and 2.

TABLE 2

| | Manufacturing conditions of sample | | | |
|---|---|---|---|---|
| | $d_1/d_2$ | $d_1/L$ | $d_3/d_2$ | $D/d_1$ |
| Example 1 | 0.952 | 1 | 0.0071 | 0.125 |
| Example 2 | 0.857 | 0.90 | 0.0071 | 0.133 |
| Example 3 | 0.857 | 0.90 | 0.0071 | 0.150 |
| Example 4 | 0.952 | 1 | 0.0095 | 0.130 |
| Example 5 | 0.826 | 0.95 | 0.0087 | 0.184 |
| Example 6 | 0.978 | 1 | 0.0087 | 0.067 |
| Example 7 | 0.905 | 0.95 | 0.0081 | 0.116 |
| Example 8 | 0.857 | 0.80 | 0.0167 | 0.089 |
| Example 9 | 0.881 | 0.82 | 0.0167 | 0.097 |
| Example 10 | 0.929 | 0.87 | 0.0190 | 0.128 |
| Example 11 | 0.929 | 0.87 | 0.0119 | 0.123 |
| Example 12 | 0.952 | 0.89 | 0.0143 | 0.180 |
| Example 13 | 0.976 | 1.03 | 0.0119 | 0.200 |
| Example 14 | 0.976 | 1.03 | 0.0119 | 0.122 |

TABLE 1

| | Manufacturing conditions of sample including through electrode | | | | | | | | |
|---|---|---|---|---|---|---|---|---|---|
| | Spherical conductor | | | Through hole | | | Concave | Glass powder | | |
| | | Maximum diameter $d_1$ | Volume $V_2$ | Minimum diameter $d_2$ | Minimum length L | Volume $V_1$ | portion Depth D | | Particle size $d_3$ | Supply |
| | Material | μm | mm$^3$ | μm | μm | mm$^3$ | μm | Material | μm | method |
| Example 1 | Cu | 200 | 0.00394 | 210 | 200 | 0.00721 | 25 | ZnO•B$_2$O$_3$•SiO$_2$ | 1.5 | Liquid |
| Example 2 | Fe—Ni | 180 | 0.00287 | 210 | 200 | 0.00721 | 24 | ZnO•B$_2$O$_3$•SiO$_2$ | 1.5 | Liquid |
| Example 3 | Cu | 180 | 0.00287 | 210 | 200 | 0.00721 | 27 | SiO$_2$•B$_2$O$_3$•Na$_2$O•Al$_2$O$_3$ | 1.5 | Liquid |
| Example 4 | Cu | 200 | 0.00394 | 210 | 200 | 0.00721 | 26 | ZnO•B$_2$O$_3$•SiO$_2$ | 2.0 | Liquid |
| Example 5 | Cu | 190 | 0.00338 | 230 | 200 | 0.00865 | 35 | ZnO•B$_2$O$_3$•SiO$_2$ | 2.0 | Liquid |
| Example 6 | Cu | 225 | 0.00561 | 230 | 225 | 0.00973 | 15 | ZnO•B$_2$O$_3$•SiO$_2$ | 2.0 | Liquid |
| Example 7 | Cu | 190 | 0.00338 | 210 | 200 | 0.00721 | 22 | ZnO•B$_2$O$_3$•SiO$_2$ | 1.7 | Liquid |
| Example 8 | Cu | 180 | 0.00287 | 210 | 225 | 0.00811 | 16 | ZnO•B$_2$O$_3$•SiO$_2$ | 3.5 | Liquid |
| Example 9 | Cu | 185 | 0.00312 | 210 | 225 | 0.00811 | 18 | ZnO•B$_2$O$_3$•SiO$_2$ | 3.5 | Liquid |
| Example 10 | Cu | 195 | 0.00365 | 210 | 225 | 0.00811 | 25 | ZnO•B$_2$O$_3$•SiO$_2$ | 4.0 | Liquid |
| Example 11 | Cu | 195 | 0.00365 | 210 | 225 | 0.00811 | 24 | ZnO•B$_2$O$_3$•SiO$_2$ | 2.5 | Liquid |
| Example 12 | Cu | 200 | 0.00394 | 210 | 225 | 0.00811 | 36 | ZnO•B$_2$O$_3$•SiO$_2$ | 3.0 | Liquid |
| Example 13 | Cu | 205 | 0.00425 | 210 | 200 | 0.00721 | 41 | ZnO•B$_2$O$_3$•SiO$_2$ | 2.5 | Liquid |
| Example 14 | Fe—Ni—Co | 205 | 0.00425 | 210 | 200 | 0.00721 | 25 | ZnO•B$_2$O$_3$•SiO$_2$ | 2.5 | Liquid |
| Example 15 | Cu | 150 | 0.00166 | 210 | 200 | 0.00721 | 28 | ZnO•B$_2$O$_3$•SiO$_2$ | 1.5 | Liquid |
| Example 16 | Cu | 160 | 0.00202 | 210 | 200 | 0.00721 | 19 | ZnO•B$_2$O$_3$•SiO$_2$ | 1.5 | Liquid |
| Example 17 | Cu | 200 | 0.00394 | 210 | 200 | 0.00721 | 22 | ZnO•B$_2$O$_3$•SiO$_2$ | 6.0 | Liquid |
| Example 18 | Cu | 200 | 0.00394 | 210 | 200 | 0.00721 | 20 | ZnO•B$_2$O$_3$•SiO$_2$ | 5.0 | Liquid |
| Example 19 | Cu | 200 | 0.00394 | 210 | 200 | 0.00721 | 36 | ZnO•B$_2$O$_3$•SiO$_2$ | 0.9 | Liquid |
| Example 20 | Cu | 200 | 0.00394 | 210 | 200 | 0.00721 | 40 | ZnO•B$_2$O$_3$•SiO$_2$ | 0.5 | Liquid |
| Example 21 | Cu | 200 | 0.00394 | 210 | 200 | 0.00721 | 5 | ZnO•B$_2$O$_3$•SiO$_2$ | 1.5 | Liquid |
| Example 22 | Cu | 200 | 0.00394 | 210 | 200 | 0.00721 | 10 | ZnO•B$_2$O$_3$•SiO$_2$ | 1.5 | Liquid |
| Example 23 | Fe—Ni | 180 | 0.00287 | 210 | 200 | 0.00721 | 40 | ZnO•B$_2$O$_3$•SiO$_2$ | 1.5 | Liquid |
| Example 24 | Fe—Ni—Co | 180 | 0.00287 | 210 | 200 | 0.00721 | 50 | ZnO•B$_2$O$_3$•SiO$_2$ | 1.5 | Liquid |
| Example 25 | Cu | 200 | 0.00394 | 210 | 200 | 0.00721 | 25 | ZnO•B$_2$O$_3$•SiO$_2$ | 2.2 | Powder |
| Example 26 | Fe—Ni | 190 | 0.00338 | 210 | 200 | 0.00721 | 24 | ZnO•B$_2$O$_3$•SiO$_2$ | 1.4 | Powder |
| Example 27 | Fe—Ni | 180 | 0.00287 | 210 | 200 | 0.00721 | 28 | SiO$_2$•B$_2$O$_3$•Na$_2$O•Al$_2$O$_3$ | 1.8 | Powder |
| Example 28 | Fe—Ni—Co | 180 | 0.00287 | 210 | 200 | 0.00721 | 26 | ZnO•B$_2$O$_3$•SiO$_2$ | 1.2 | Powder |
| Comparative Example 1 | Cu paste | | | 210 | 200 | 0.00721 | — | — | — | — |
| Comparative Example 2 | Cu | 30 | 0.00001 | 210 | 200 | 0.00721 | 25 | ZnO•B$_2$O$_3$•SiO$_2$ | 1.5 | Liquid |
| Comparative Example 3 | Fe—Ni | 40 | 0.00003 | 210 | 200 | 0.00721 | 29 | ZnO•B$_2$O$_3$•SiO$_2$ | 1.5 | Liquid |
| Comparative Example 4 | Fe—Ni—Co | 50 | 0.00006 | 210 | 200 | 0.00721 | 21 | ZnO•B$_2$O$_3$•SiO$_2$ | 1.5 | Liquid |
| Comparative Example 5 | Cu | 225 | 0.00561 | 210 | 225 | 0.00811 | — | — | — | — |

TABLE 2-continued

| | Manufacturing conditions of sample | | | |
|---|---|---|---|---|
| | $d_1/d_2$ | $d_1/L$ | $d_3/d_2$ | $D/d_1$ |
| Example 15 | 0.714 | 0.75 | 0.0071 | 0.187 |
| Example 16 | 0.762 | 0.8 | 0.0071 | 0.119 |
| Example 17 | 0.952 | 1 | 0.0286 | 0.110 |
| Example 18 | 0.952 | 1 | 0.0238 | 0.100 |
| Example 19 | 0.952 | 1 | 0.0043 | 0.180 |
| Example 20 | 0.952 | 1 | 0.0024 | 0.200 |
| Example 21 | 0.952 | 1 | 0.0071 | 0.025 |
| Example 22 | 0.952 | 1 | 0.0071 | 0.050 |
| Example 23 | 0.857 | 0.9 | 0.0071 | 0.222 |
| Example 24 | 0.857 | 0.9 | 0.0071 | 0.278 |
| Example 25 | 0.952 | 1 | 0.0105 | 0.125 |
| Example 26 | 0.905 | 0.95 | 0.0067 | 0.126 |
| Example 27 | 0.857 | 0.9 | 0.0086 | 0.156 |
| Example 28 | 0.857 | 0.9 | 0.0057 | 0.144 |
| Comparative Example 1 | — | — | — | — |
| Comparative Example 2 | 0.143 | 0.15 | 0.0071 | 0.833 |
| Comparative Example 3 | 0.190 | 0.20 | 0.0071 | 0.725 |
| Comparative Example 4 | 0.238 | 0.25 | 0.0071 | 0.420 |
| Comparative Example 5 | 1.071 | 1.00 | — | — |

2. Evaluation of Sample 2.1 Evaluation of Conductivity

First, a thermal shock test was performed on the samples obtained in the examples and the comparative examples at a temperature of −40° C. to 85° C. (30 minutes for each) as one cycle, and this test was repeatedly performed for 100 cycles.

Subsequently, a high-temperature high-humidity test was performed in which the sample was left for 500 hours under an environment with a temperature of 85° C. and a humidity of 80% to 85%.

Thereafter, a resistance value of the through electrode was measured by the four-terminal method. Then, conductivity was evaluated on the basis of the following evaluation criteria. Meanwhile, a digital multimeter was used for the measurement, and an applied current was set to 1 mA.

Evaluation Criteria of Conductivity

A: resistance value is extremely small (less than 5 mΩ)

B: resistance value is slightly small (equal to or greater than 5 mΩ and less than 50 mΩ)

C: resistance value is slightly large (equal to or greater than 50 mΩ and less than 100 mΩ)

D: resistance value is extremely large (equal to or greater than 100 mΩ)

In addition, a sample different from the above-described samples was prepared. Then, a thermal shock test was newly performed on the sample at a temperature of −40° C. to 85° C. (30 minutes for each) as one cycle, and this test was repeatedly performed for 1000 cycles.

Subsequently, a high-temperature high-humidity test was performed in which the sample was left for 500 hours under an environment with a temperature of 85° C. and a humidity of 80% to 85%.

Thereafter, a resistance value of the through electrode was measured by the four-terminal method. Then, conductivity was evaluated on the basis of the above-described evaluation criteria of conductivity. Meanwhile, a digital multimeter was used for the measurement, and an applied current was set to 1 mA.

Further, a sample different from the above-described samples was prepared. Then, a thermal shock test was newly performed on the sample at a temperature of −40° C. to 85° C. (30 minutes for each) as one cycle, and this test was repeatedly performed for 10000 cycles.

Subsequently, a high-temperature high-humidity test was performed in which the sample was left for 500 hours under an environment with a temperature of 85° C. and a humidity of 80% to 85%.

Thereafter, a resistance value of the through electrode was measured by the four-terminal method. Then, conductivity was evaluated on the basis of the above-described evaluation criteria of conductivity. Meanwhile, a digital multimeter was used for the measurement, and an applied current was set to 1 mA.

2.2 Evaluation of Airtightness

Next, airtightness was measured with respect to the samples, obtained in the examples and the comparative examples, which had been subjected to the evaluation of 2.1 by using a leakage detector (vacuum method). Then, the airtightness was evaluated on the basis of the following evaluation criteria. Meanwhile, helium gas was used for the detection of leakage.

Evaluation Criteria of Airtightness

A: the amount of leakage is particularly small (less than $1×10^{−8}$ Pa·m³/s)

B: the amount of leakage is slightly small (equal to or greater than $1×10^{−8}$ Pa·m³/s and less than $1×10^{−6}$ Pa·m³/s)

C: the amount of leakage is slightly large (equal to or greater than $1×10^{−6}$ Pa·m³/s and less than $1×10^{−4}$ Pa·m³/s)

D: the amount of leakage is particularly large (equal to or greater than $1×10^{−4}$ Pa·m³/s)

The above-described evaluation results are shown in Table 3.

TABLE 3

| | Evaluation results | | | | | |
|---|---|---|---|---|---|---|
| | Conductivity | | | Airtightness | | |
| | 100 cycles | 1000 cycles | 10000 cycles | 100 cycles | 1000 cycles | 10000 cycles |
| Example 1 | A | A | A | A | A | B |
| Example 2 | B | B | C | A | A | A |
| Example 3 | A | A | A | A | A | B |
| Example 4 | A | A | A | A | A | B |
| Example 5 | A | A | A | B | B | B |
| Example 6 | A | A | A | B | B | C |
| Example 7 | A | A | A | A | A | B |
| Example 8 | B | B | B | B | B | B |
| Example 9 | B | B | B | B | B | B |
| Example 10 | A | A | A | B | B | B |
| Example 11 | A | A | A | A | A | B |
| Example 12 | A | A | A | A | A | B |
| Example 13 | A | A | A | B | B | C |
| Example 14 | B | B | C | B | B | B |
| Example 15 | C | C | C | C | C | C |
| Example 16 | B | B | B | C | C | C |
| Example 17 | A | A | A | C | C | C |
| Example 18 | A | A | A | C | C | C |
| Example 19 | A | A | A | C | C | C |
| Example 20 | A | A | A | C | C | C |
| Example 21 | A | B | B | A | B | B |
| Example 22 | A | A | A | A | A | B |
| Example 23 | A | A | A | A | A | B |
| Example 24 | A | A | A | A | B | C |
| Example 25 | A | A | A | A | A | B |
| Example 26 | B | B | C | A | A | B |
| Example 27 | B | B | C | A | A | B |
| Example 28 | B | B | C | B | B | B |
| Comparative Example 1 | C | D | D | C | D | D |

TABLE 3-continued

| | Evaluation results | | | | | |
|---|---|---|---|---|---|---|
| | Conductivity | | | Airtightness | | |
| | 100 cycles | 1000 cycles | 10000 cycles | 100 cycles | 1000 cycles | 10000 cycles |
| Comparative Example 2 | C | C | D | D | D | D |
| Comparative Example 3 | C | D | D | D | D | D |
| Comparative Example 4 | C | D | D | D | D | D |
| Comparative Example 5 | A | A | B | D | D | D |

As is apparent from Table 3, both the conductivity and the airtightness of the through electrode were achieved in the samples obtained in the respective examples.

On the other hand, evaluation results indicating a low airtightness were obtained in the sample obtained in the respective comparative examples.

As described above, according to the invention, it was seen that it is possible to manufacture a wiring board having both conductivity and airtightness.

The entire disclosure of Japanese Patent Application No. 2013-234422, filed Nov. 12, 2013, and 2014-167732, filed Aug. 20, 2014, are expressly incorporated by reference herein.

What is claimed is:

1. A wiring board comprising:
   a ceramic substrate having a cylindrical-shaped through hole, the through hole penetrating entirely through the ceramic substrate;
   a spherical conductor nested within the through hole;
   an annular glass seal adhered to the spherical conductor and to an inner surface of the through hole so as to seal the through hole; and
   an electrode on the ceramic substrate, the electrode spanning an opening of the through hole and directly contacting a vertex of the spherical conductor,
   wherein the seal directly contacts the electrode adjacent the vertex of the spherical conductor.

2. The wiring board according to claim 1, further comprising an annular concavity which surrounds the vertex of the spherical conductor, the concavity being recessed relative to the vertex of the spherical conductor in a thickness direction of the ceramic substrate.

3. The wiring board according to claim 2, wherein the seal and the vertex of the spherical conductor are exposed by the concavity.

4. An element housing package comprising the wiring board according to claim 1.

5. An element housing package comprising the wiring board according to claim 2.

6. An element housing package comprising the wiring board according to claim 3.

7. An electronic device comprising:
   the element housing package according to claim 4;
   an element that is accommodated in the element housing package; and
   an electric wiring that electrically connects the wiring board and the element which are included in the element housing package.

8. The electronic device according to claim 7, wherein the element is a vibrator element.

9. An electronic apparatus comprising the electronic device according to claim 5.

10. An electronic apparatus comprising the electronic device according to claim 6.

11. A moving object comprising the electronic device according to claim 5.

12. A moving object comprising the electronic device according to claim 6.

13. The wiring board according to claim 1,
    wherein when a maximum diameter of the spherical conductor is $d_1$ and a minimum diameter of the through hole is $d_2$, $d_1/d_2$ is equal to or greater than 0.8 and equal to or less than 1.

14. The wiring board according to claim 1,
    wherein when a maximum diameter of the spherical conductor is $d_1$ and a minimum length of the through hole in a thickness direction of the ceramic substrate is L, $d_1/L$ is equal to or greater than 0.8 and equal to or less than 1.

* * * * *